United States Patent
Khlat et al.

(10) Patent No.: US 10,097,161 B2
(45) Date of Patent: *Oct. 9, 2018

(54) COMPENSATION CIRCUIT FOR ACOUSTIC RESONATORS

(71) Applicant: Qorvo US, Inc., Greensboro, NC (US)

(72) Inventors: Nadim Khlat, Cugnaux (FR); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/275,957

(22) Filed: Sep. 26, 2016

(65) Prior Publication Data
US 2017/0093369 A1    Mar. 30, 2017

Related U.S. Application Data

(60) Provisional application No. 62/232,746, filed on Sep. 25, 2015.

(51) Int. Cl.
*H03H 9/54* (2006.01)
*H03H 9/64* (2006.01)
(Continued)

(52) U.S. Cl.
CPC .......... *H03H 9/542* (2013.01); *H03H 9/0004* (2013.01); *H03H 9/02086* (2013.01);
(Continued)

(58) Field of Classification Search
CPC .... H03H 7/09; H03H 9/0004; H03H 9/02086; H03H 9/02433; H03H 9/02818;
(Continued)

(56) References Cited

U.S. PATENT DOCUMENTS

| | | | | |
|---|---|---|---|---|
| 3,731,230 A | * | 5/1973 | Cerny, Jr. | H03B 5/362 331/105 |
| 3,875,533 A | * | 4/1975 | Irwin | H03B 5/362 331/116 R |

(Continued)

FOREIGN PATENT DOCUMENTS

JP    2012257050 A    12/2012

OTHER PUBLICATIONS

Non-Final Office Action for U.S. Appl. No. 14/757,587, dated Sep. 13, 2016, 12 pages.
(Continued)

*Primary Examiner* — Barbara Summons
(74) *Attorney, Agent, or Firm* — Withrow & Terranova, P.L.L.C.

(57) ABSTRACT

In one embodiment, filter circuitry includes a series acoustic resonator between first and second nodes. A main series resonance is provided between the first node and the second node at a main resonance frequency through the series acoustic resonator. A compensation circuit includes first and second inductors coupled in series between the first node and the second node, wherein the first inductor and the second inductor are negatively coupled with one another and a common node is provided between the first and second inductors. The compensation circuit also includes first and second shunt acoustic resonators, which are coupled in parallel with one another between the common node and a fixed voltage node. First and second series resonances at first and second resonance frequencies are provided between the first node and the second node through compensation circuit wherein the first and second resonance frequencies are different.

26 Claims, 22 Drawing Sheets

(51) Int. Cl.
*H03H 9/00* (2006.01)
*H03H 9/02* (2006.01)
*H03H 9/60* (2006.01)
*H03H 7/09* (2006.01)

(52) U.S. Cl.
CPC ........ *H03H 9/02433* (2013.01); *H03H 9/605* (2013.01); *H03H 9/6406* (2013.01); *H03H 9/6483* (2013.01); *H03H 7/09* (2013.01)

(58) Field of Classification Search
CPC ...... H03H 9/542; H03H 9/605; H03H 9/6406; H03H 9/6483; H03H 9/6489
USPC ................................ 333/187, 189, 193, 195
See application file for complete search history.

(56) References Cited

U.S. PATENT DOCUMENTS

| | | | | |
|---|---|---|---|---|
| 4,577,168 | A * | 3/1986 | Hartmann | H03H 9/6409 333/170 |
| 5,291,159 | A | 3/1994 | Vale | |
| 6,067,391 | A | 5/2000 | Land | |
| 6,714,099 | B2 * | 3/2004 | Hikita | H03H 9/0028 333/133 |
| 6,720,844 | B1 | 4/2004 | Lakin | |
| 7,804,374 | B1 * | 9/2010 | Brown | H03B 5/36 331/116 FE |
| 8,576,024 | B2 | 11/2013 | Erb et al. | |
| 8,923,794 | B2 | 12/2014 | Aigner | |
| 9,847,769 | B2 * | 12/2017 | Khlat | H03H 9/542 |
| 2005/0093648 | A1 * | 5/2005 | Inoue | H03H 9/706 333/133 |
| 2008/0007369 | A1 | 1/2008 | Barber et al. | |
| 2011/0210787 | A1 * | 9/2011 | Lee | H03F 1/56 330/126 |
| 2015/0222246 | A1 | 8/2015 | Nosaka | |
| 2015/0369153 | A1 | 12/2015 | Tsunooka et al. | |
| 2016/0028364 | A1 | 1/2016 | Takeuchi | |
| 2016/0191012 | A1 * | 6/2016 | Khlat | H03H 9/542 333/189 |
| 2016/0191014 | A1 * | 6/2016 | Khlat | H03H 9/542 343/850 |
| 2016/0191016 | A1 * | 6/2016 | Khlat | H03H 9/542 455/129 |
| 2017/0093370 | A1 * | 3/2017 | Khlat | H03H 9/6406 |

OTHER PUBLICATIONS

Notice of Allowance for U.S. Appl. No. 14/757,587, dated Mar. 9, 2017, 8 pages.
Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Non-Final Office Action for U.S. Appl. No. 15/004,084, dated Jun. 12, 2017, 9 pages.
Non-Final Office Action for U.S. Appl. No. 14/757,651, dated Jun. 9, 2017, 11 pages.
Ex Parte Quayle Action for U.S. Appl. No. 15/347,452, mailed Jun. 15, 2017, 7 pages.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
U.S. Appl. No. 15/347,428, filed Nov. 9, 2016.
U.S. Appl. No. 15/347,452, filed Nov. 9, 2016.
U.S. Appl. No. 15/490,381, filed Apr. 18, 2017.
U.S. Appl. No. 15/586,374, filed May 4, 2017.
U.S. Appl. No. 15/644,922, filed Jul. 10, 2017.
U.S. Appl. No. 15/697,658, filed Sep. 7, 2017.
U.S. Appl. No. 15/701,759, filed Sep. 12, 2017.
U.S. Appl. No. 15/720,706, filed Sep. 29, 2017.
U.S. Appl. No. 15/727,117, filed Oct. 6, 2017.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.

* cited by examiner

T-MODEL OF COMPENSATION CIRCUIT

π MODEL OF COMPENSATION CIRCUIT

COMPENSATION CIRCUIT FOR ACOUSTIC RESONATORS

RELATED APPLICATIONS

This application claims the benefit of provisional patent application Ser. No. 62/232,746, filed Sep. 25, 2015, the disclosure of which is hereby incorporated herein by reference in its entirety.

FIELD OF THE INVENTION

The present disclosure relates to acoustic resonators and in particular to a compensation circuit for acoustic resonators.

BACKGROUND

Acoustic resonators, such as Surface Acoustic Wave (SAW) resonators and Bulk Acoustic Wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW- and BAW-based filters also have relatively low insertion loss, tend to decrease in size as the frequency of operation increases, and are relatively stable over wide temperature ranges. As such, SAW- and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

To better understand acoustic resonators and various terminology associated therewith, the following provides an overview of a BAW resonator. However, the concepts described herein may employ any type of acoustic resonator and are not limited to SAW- and BAW-based resonators. An exemplary BAW resonator 10 is illustrated in FIG. 1. The BAW resonator 10 generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), or like material, and the piezoelectric layer 18 may be formed of Aluminum Nitride (AlN), Zinc Oxide (ZnO), or other appropriate piezoelectric material. Although shown in FIG. 1 as each including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically propagating acoustic waves in the transducer 16. Acoustic waves traveling upward are reflected back into the transducer 16 by the air-metal boundary at the top surface of the top electrode 20. Acoustic waves traveling downward are reflected back into the transducer 16 by the reflector 14 or by an air cavity, which is provided just below the transducer in a Film BAW Resonator (FBAR).

The reflector 14 is typically formed by a stack of reflector layers (RL) 28, which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 varies from one design to another.

The magnitude (Z) and phase ($\phi$) of the electrical impedance as a function of the frequency for a relatively ideal BAW resonator 10 is provided in FIG. 2. The magnitude (Z) of the electrical impedance is illustrated by the solid line, whereas the phase ($\phi$) of the electrical impedance is illustrated by the dashed line. A unique feature of the BAW resonator 10 is that it has both a resonance frequency and an anti-resonance frequency. The resonance frequency is typically referred to as the series resonance frequency ($f_s$), the anti-resonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness of the piezoelectric layer 18 and the mass of the bottom and top electrodes 20 and 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$) and a very high resistance at the parallel resonance frequency ($f_p$). The electrical nature of the BAW resonator 10 lends itself to the realization of a very high Q (quality factor) inductance over a relatively short range of frequencies, which has proved to be very beneficial in high-frequency filter networks, especially those operating at frequencies around 1.8 GHz and above.

Unfortunately, the phase ($\phi$) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

As illustrated in FIG. 4, a border (BO) ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus of the spurious mode, in the passband of the phase curve, which resides between the series resonance frequency ($f_s$) and the parallel resonance frequency ($f_p$). Circle B shows suppression of the ripple, and thus of the spurious modes, above the parallel resonance frequency ($f_p$). Notably, the spurious mode in the upper shoulder of the passband, which is just below the parallel resonance frequency $f_p$, and the spurious modes above the passband are suppressed, as evidenced by the smooth or substantially ripple free phase curve between the series resonance frequency ($f_s$) and the parallel resonance frequency ($f_p$) and above the parallel resonance frequency ($f_p$).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency ($f_s$), the BO ring 30 has little or no impact on those spurious modes below the series resonance frequency ($f_s$), as shown by the ripples in the phase curve below the series resonance frequency ($f_s$) in FIG. 3B. A technique referred to as apodization is often used to suppress the spurious modes that fall below the series resonance frequency ($f_s$).

Apodization tries to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed, as evidence by the smooth or substantially ripple free phase curve below the series resonance frequency ($f_s$). Assuming no BO ring 30 is provided, one can readily see in FIG. 3C that apodization fails to suppress those spurious modes above the series resonance frequency ($f_s$). As such, the typical BAW resonator 10 employs both apodization and the BO ring 30.

As noted previously, BAW resonators 10 are often used in filter networks that operate at high frequencies and require high Q values. A basic ladder network 40 is illustrated in FIG. 5A. The ladder network 40 includes two series resonators $B_{SER}$ and two shunt resonators $B_{SH}$, which are arranged in a traditional ladder configuration. Typically, the series resonators $B_{SER}$ have the same or similar first frequency response, and the shunt resonators $B_{SH}$ have the same or similar second frequency response, which is different from the first frequency response, as shown in FIG. 5B. In many applications, the shunt resonators $B_{SH}$ are detuned versions of the series resonators $B_{SER}$. As a result, the frequency responses for the series resonators $B_{SER}$ and the shunt resonators $B_{SH}$ are generally very similar, yet shifted relative to one another such that the parallel resonance frequency ($f_{p,SH}$) of the shunt resonators approximates the series resonance frequency ($f_{s,SER}$) of the series resonators $B_{SER}$. Note that the series resonance frequency ($f_{s,SH}$) of the shunt resonators $B_{SH}$ is less than the series resonance frequency ($f_{s,SER}$) of the series resonators $B_{SER}$. The parallel resonance frequency ($f_{p,SH}$) of the shunt resonators $B_{SH}$ is less than the parallel resonance frequency ($f_{p,SER}$) of the series resonators $B_{SER}$.

FIG. 5C is associated with FIG. 5B and illustrates the response of the ladder network 40. The series resonance frequency ($f_{s,SH}$) of the shunt resonators $B_{SH}$ corresponds to the low side of the passband's skirt (phase 2), and the parallel resonance frequency ($f_{p,SER}$) of the series resonators $B_{SER}$ corresponds to the high side of the passband's skirt (phase 4). The substantially aligned series resonance frequency ($f_{s,SER}$) of the series resonators $B_{SER}$ and the parallel resonance frequency ($f_{p,SH}$) of the shunt resonators $B_{SH}$ fall within the passband. FIGS. 6A through 6E provide circuit equivalents for the five phases of the response of the ladder network 40. During the first phase (phase 1, FIGS. 5C, 6B), the ladder network 40 functions to attenuate the input signal. As the series resonance frequency ($f_{s,SH}$) of the shunt resonators $B_{SH}$ is approached, the impedance of the shunt resonators $B_{SH}$ drops precipitously such that the shunt resonators $B_{SH}$ essentially provide a short to ground at the series resonance frequency ($f_{s,SH}$) of the shunt resonators (phase 2, FIGS. 5C, 6B). At the series resonance frequency ($f_{s,SH}$) of the shunt resonators $B_{SH}$ (phase 2), the input signal is essentially blocked from the output of the ladder network 40.

Between the series resonance frequency ($f_{s,SH}$) of the shunt resonators $B_{SH}$ and the parallel resonance frequency ($f_{p,SER}$) of the series resonators $B_{SER}$, which corresponds to the passband, the input signal is passed to the output with relatively little or no attenuation (phase 3, FIGS. 5C, 6C). Within the passband, the series resonators $B_{SER}$ present relatively low impedance, whereas the shunt resonators $B_{SH}$ present a relatively high impedance, wherein the combination of the two leads to a flat passband with steep low- and high-side skirts. As the parallel resonance frequency ($f_{p,SER}$) of the series resonators $B_{SER}$ is approached, the impedance of the series resonators $B_{SER}$ becomes very high, such that the series resonators $B_{SER}$ essentially present themselves as open at the parallel resonance frequency ($f_{p,SER}$) of the series resonators (phase 4, FIGS. 5C, 6D). At the parallel resonance frequency ($f_{p,SER}$) of the series resonators $B_{SER}$ (phase 4), the input signal is again essentially blocked from the output of the ladder network 40. During the final phase (phase 5, FIGS. 5C, 6E), the ladder network 40 functions to attenuate the input signal, in a similar fashion to that provided in phase 1. As the parallel resonance frequency ($f_{p,SER}$) of the series resonators $B_{SER}$ is passed, the impedance of the series resonators $B_{SER}$ decreases and the impedance of the shunt resonators $B_{SH}$ normalizes. Thus, the ladder network 40 functions to provide a high Q passband between the series resonance frequency ($f_{s,SH}$) of the shunt resonators $B_{SH}$ and the parallel resonance frequency ($f_{p,SER}$)

of the series resonators $B_{SER}$. The ladder network 40 provides extremely high attenuation at both the series resonance frequency ($f_{s,SH}$) of the shunt resonators $B_{SH}$ and the parallel resonance frequency ($f_{p,SER}$) of the series resonators. The ladder network 40 provides good attenuation below the series resonance frequency ($f_{s,SH}$) of the shunt resonators $B_{SH}$ and above the parallel resonance frequency ($f_{p,SER}$) of the series resonators $B_{SER}$. As noted previously, there is a constant need to improve the performance of acoustic resonators and filters that are based thereon.

Those skilled in the art will appreciate the scope of the present disclosure and realize additional aspects thereof after reading the following detailed description of the preferred embodiments in association with the accompanying drawing figures.

SUMMARY

The present disclosure relates to filter circuitry including a series acoustic resonator between first and second nodes and a compensation circuit in parallel with the series acoustic resonator. A main series resonance is provided between the first node and the second node at a main resonance frequency through the series acoustic resonator. The compensation circuit includes first and second inductors coupled in series between the first node and the second node, wherein the first inductor and the second inductor are negatively coupled with one another and a common node is provided between the first and second inductors. The compensation circuit also includes first and second shunt acoustic resonators, which are coupled in parallel with one another between the common node and a fixed voltage node. First and second series resonances at first and second resonance frequencies are provided between the first node and the second node through compensation circuit wherein the first and second resonance frequencies are different.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
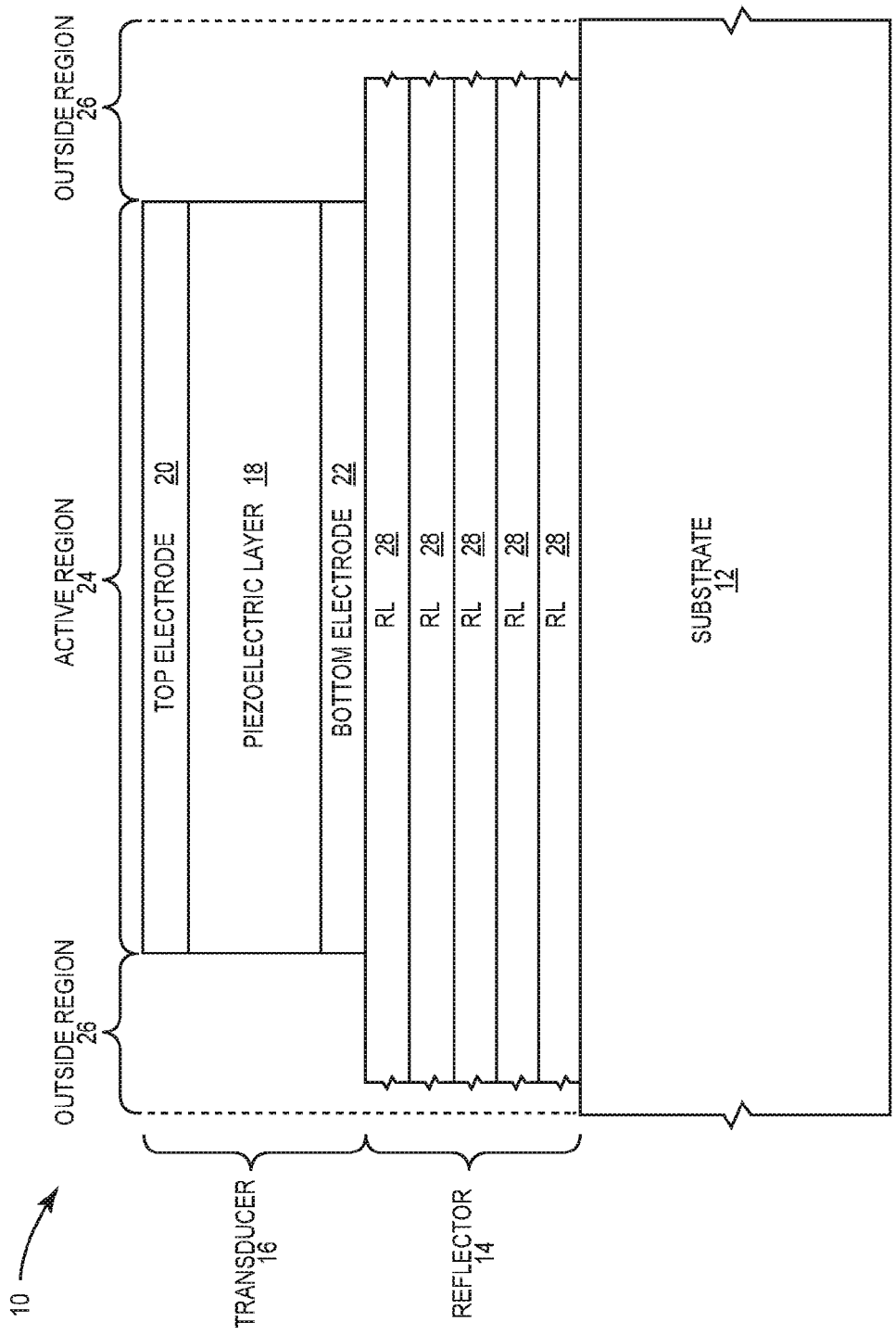
FIG. 1 illustrates a conventional Bulk Acoustic Wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the figures. It will be understood that these terms and those discussed previously are intended to encompass different orientations of the device in addition to the orientation depicted in the figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to filter circuitry that includes at least one series acoustic resonator between first and second nodes and a compensation circuit in parallel with the series acoustic resonator. At least one main series resonance is provided between the first node and the second node at a main resonance frequency through the at least one series acoustic resonator. The compensation circuit includes first and second inductors coupled in series between the first node and the second node, wherein the first inductor and the second inductor are negatively coupled with one another and a common node is provided between the first and second inductors. The compensation circuit also includes first and second shunt acoustic resonators, which are coupled in parallel with one another between the common node and a fixed voltage node. First and second series resonances at first and second resonance frequencies are provided between the first node and the second node through compensation circuit wherein the first and second resonance frequencies are different.

The compensation circuit provides two primary functions. The first is to provide a negative capacitive behavior, such that a negative capacitance is presented in parallel with the at least one series acoustic resonator. As such, the effective capacitance of the at least one series acoustic resonator is reduced, which functions to shift the parallel resonance frequency $F_p$ higher. The second function is to add one or more additional series resonances between the first and second nodes. The combination of shifting the parallel resonance frequency $F_p$ higher and adding additional series resonances through the compensation circuit allows for passbands of greater bandwidth while maintaining excellent out-of-band rejection. Details are provided below.

Figure 7:
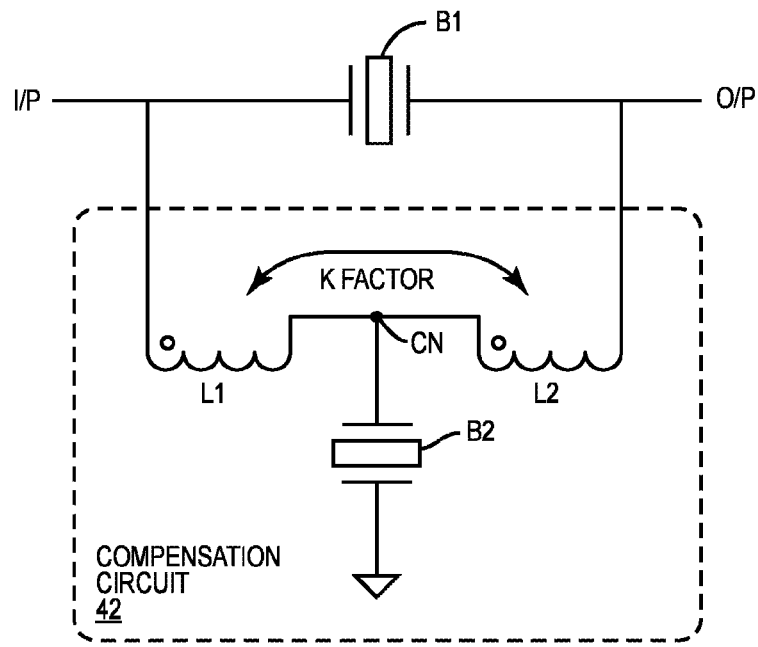
FIG. 7 illustrates an acoustic resonator in parallel with a compensation circuit, which includes a single shunt acoustic resonator.

Turning now to FIG. 7, a series resonator B1 is shown coupled between an input node I/P and an output node O/P. The series resonator B1 has a series resonance frequency $F_s$ and inherent capacitance, which generally limits the bandwidth of filters that employ the series resonator B1. In the case of a Bulk Acoustic Wave (BAW) resonator, the capacitance of the series resonator B1 is primarily caused by its inherent structure, which looks and acts like a capacitor in part because the series resonator includes the top and bottom electrodes 20, 22 (FIG. 1) that are separated by a dielectric piezoelectric layer 18. While BAW resonators are the focus of the example, other types of acoustic resonators, such as Surface Acoustic Wave resonators, are equally applicable.

A compensation circuit 42 is coupled in parallel with the series resonator B1 and functions to compensate for some of the capacitance presented by the series resonator B1. The compensation circuit 42 includes two negatively coupled inductors L1, L2 and a shunt resonator B2. The inductors L1, L2 are coupled in series between the input node I/P and the output node O/P, wherein a common node CN is provided between the inductors L1, L2. The inductors L1, L2 are magnetically coupled by a coupling factor K, wherein the dots illustrated in association with the inductors L1, L2 indicate that the magnetic coupling is negative. As such, the inductors L1, L2 are connected in electrical series and negatively coupled from a magnetic coupling perspective. As defined herein, two (or more) series-connected inductors that are negatively coupled from a magnetic perspective are inductors that are connected in electrical series; and the mutual inductance between the two inductors functions to decrease the total inductance of the two (or more) inductors.

The shunt resonator B2 is coupled between the common node CN and ground, or other fixed voltage node.

Figure 2:
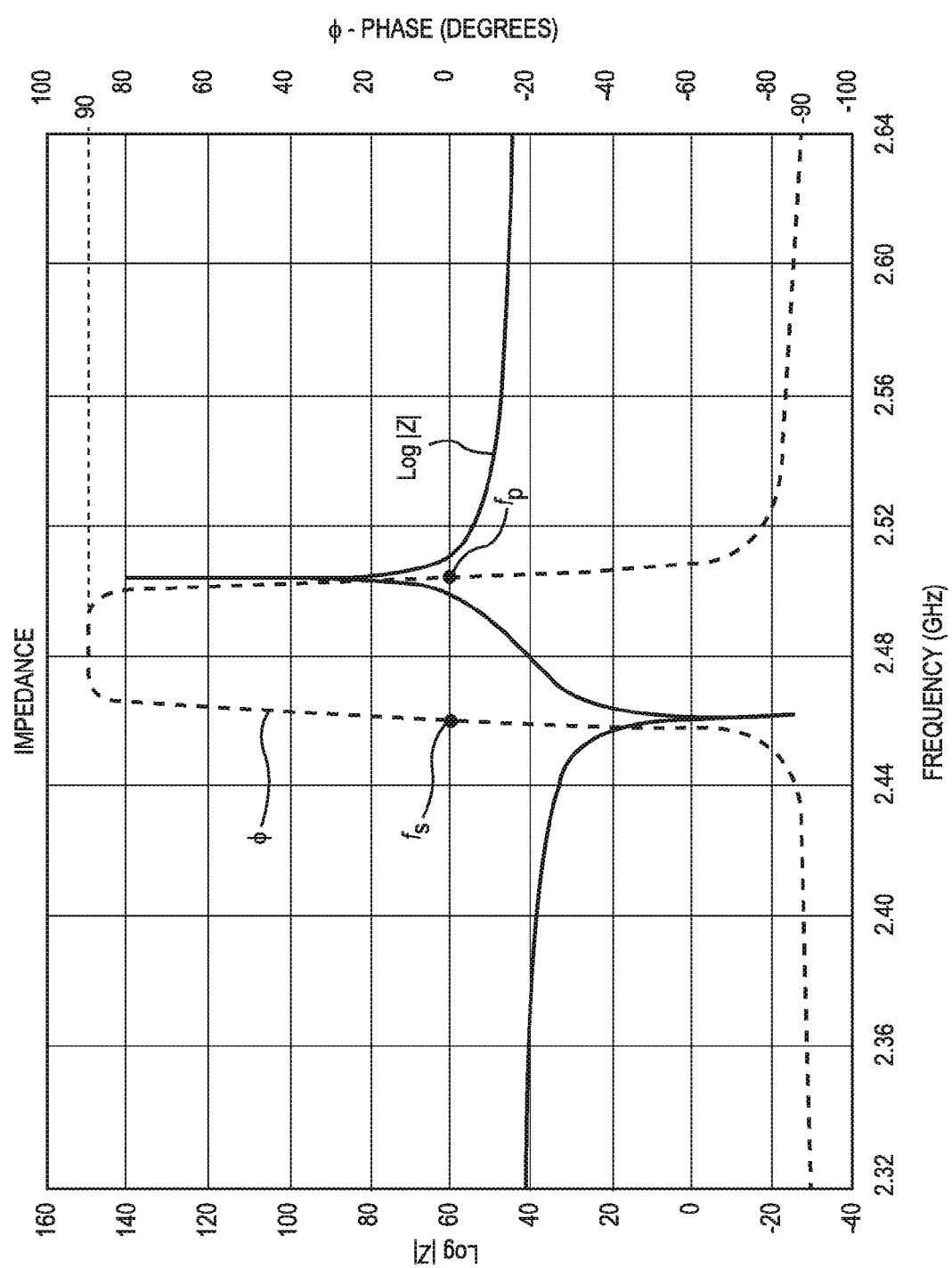
FIG. 2 is a graph of the magnitude and phase of impedance over frequency responses as a function of frequency for an ideal BAW resonator.
Figures 3A, 3B, 3C:
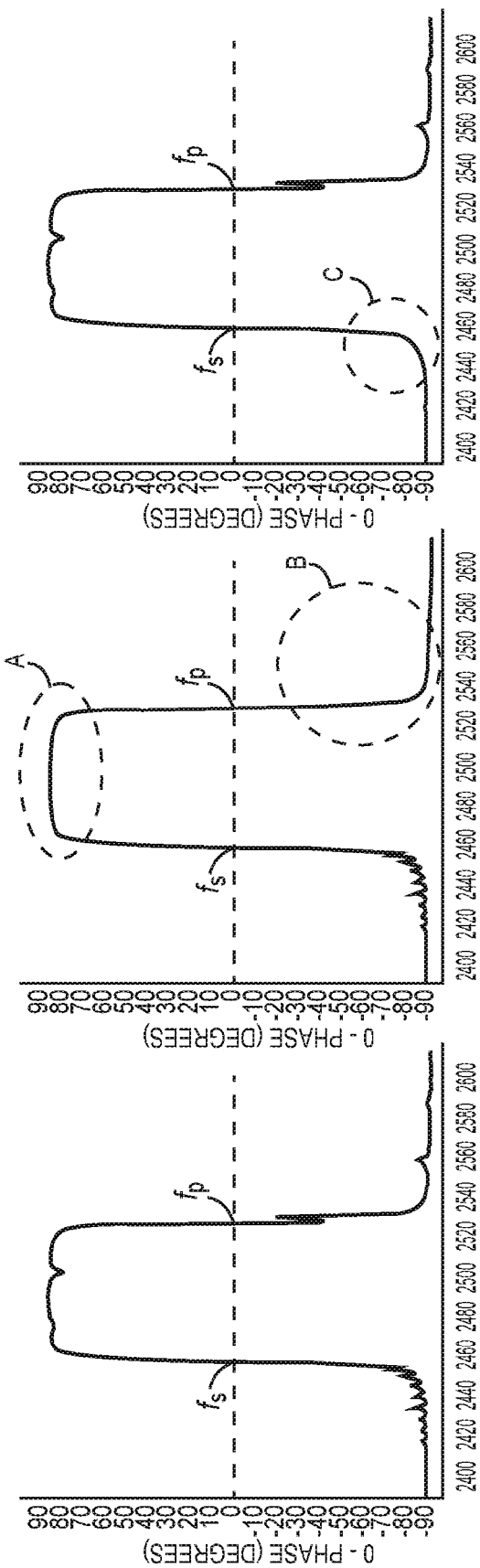
FIGS. 3A-3C are graphs of phase responses for various BAW resonator configurations.
Figure 4:
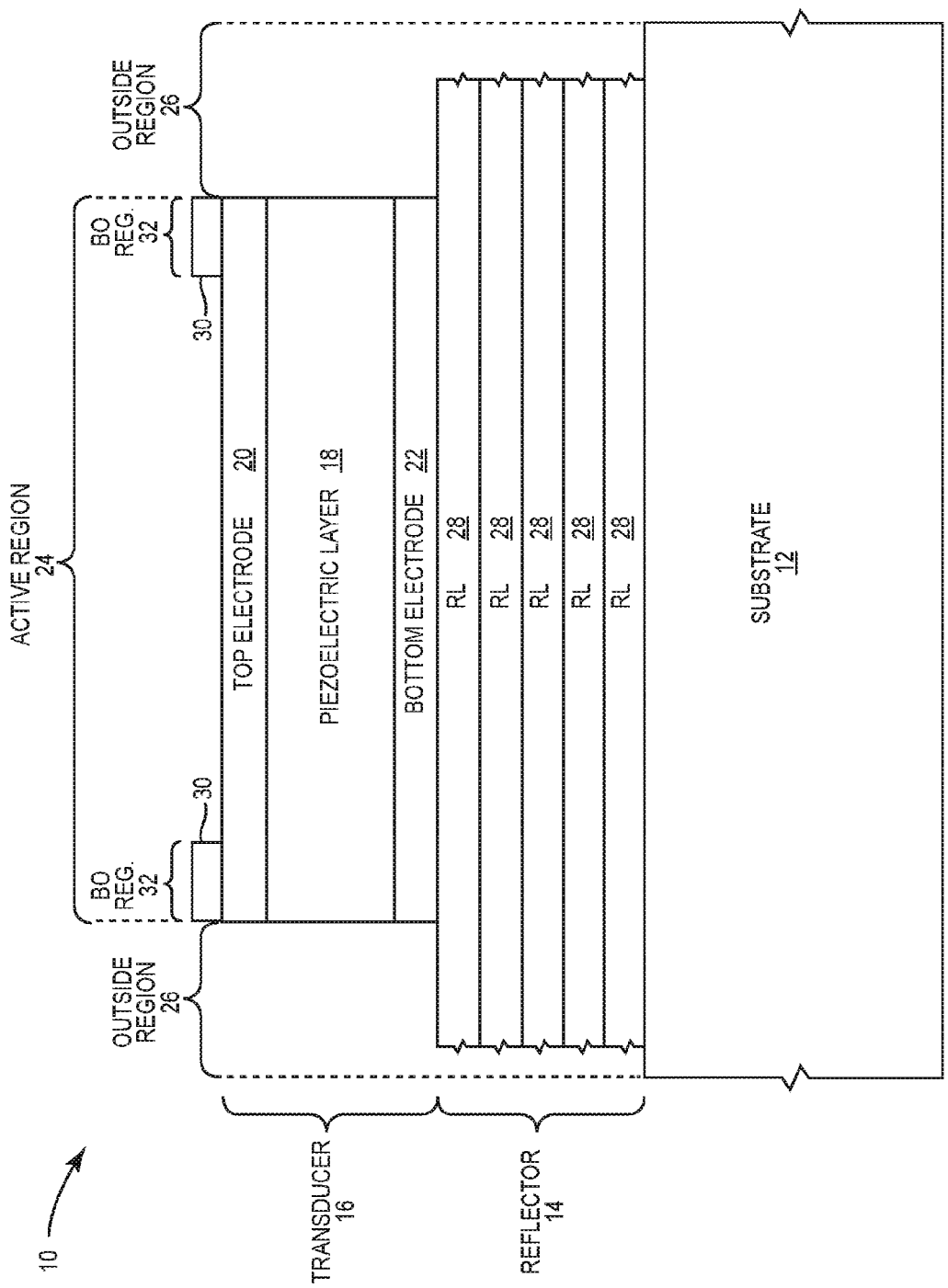
FIG. 4 illustrates a conventional BAW resonator with a border ring.
Figure 5A:
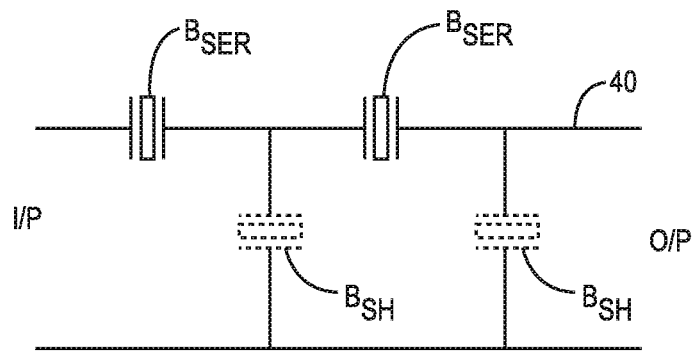
FIG. 5A is a schematic of a conventional ladder network.
Figure 5B:
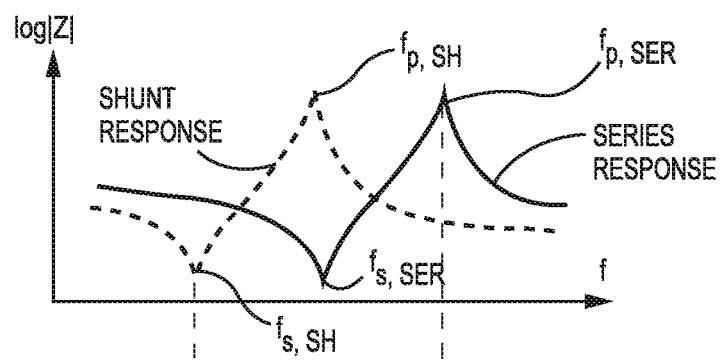
FIGS. 5B and 5C are graphs of a frequency response for BAW resonators in the conventional ladder network of FIG. 5A and a frequency response for the conventional ladder network of FIG. 5A.
Figure 5C:
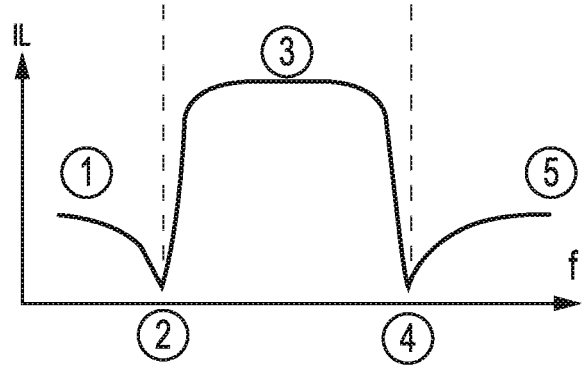
Figure 6A:
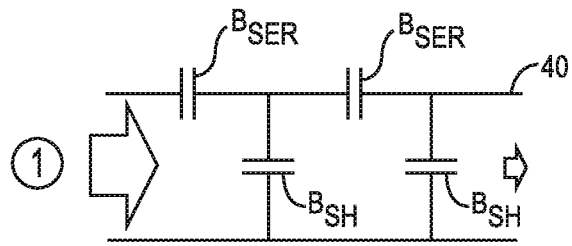
FIGS. 6A-6E are circuit equivalents for the ladder network of FIG. 5A at the frequency points 1, 2, 3, 4, and 5, which are identified in FIG. 5C.
Figure 6B:
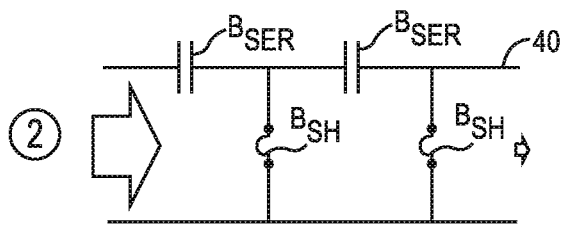
Figure 6C:
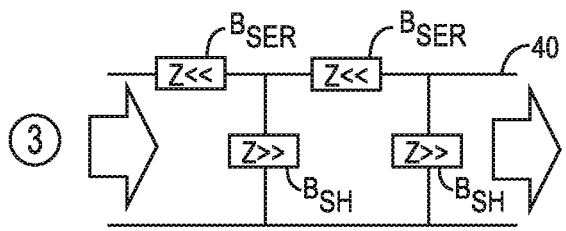
Figure 6D:
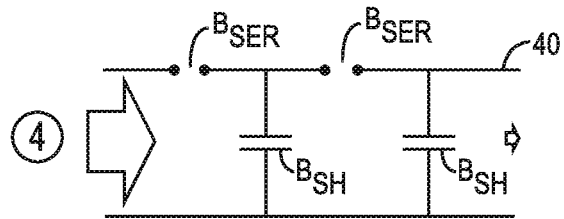
Figure 6E:
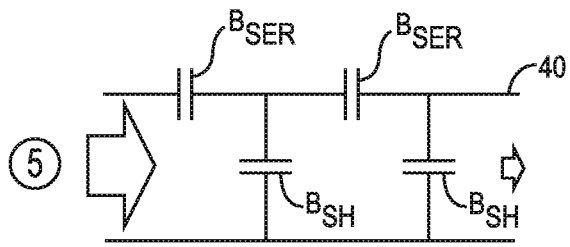
Figure 8:
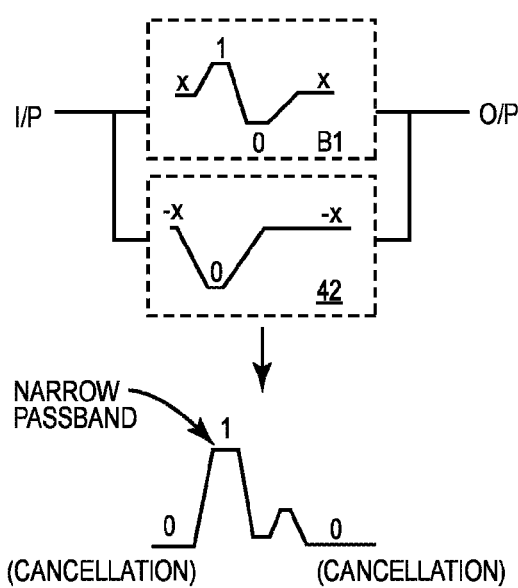
FIG. 8 is a graph that illustrates exemplary frequency responses for the acoustic resonator, compensation circuit, and overall circuit of FIG. 7.

To compensate for at least some of the capacitance of the series resonator B1, the compensation circuit 42 presents itself as a negative capacitance within certain frequency ranges, when coupled in parallel with the series resonator B1. Since capacitances in parallel are additive, providing a negative capacitance in parallel with the (positive) capacitance of the series resonator B1 effectively reduces the capacitance of the series resonator B1. With the compensation circuit 42, the series resonator B1 can actually function as a filter (instead of just a resonator) and provide a passband, albeit a fairly narrow passband, instead of a more traditional resonator response (solid line of FIG. 2). FIG. 8 graphically illustrates the frequency responses of the series resonator B1 (inside the block referenced B1), the compensation circuit 42 (inside the block referenced 42), and the overall circuit in which the compensation circuit 42 is placed in parallel with the series resonator B1. As illustrated, the overall circuit provides a relatively narrow passband. Further detail on this particular circuit topology can be found in the co-assigned U.S. patent application Ser. No. 15/004,084, filed Jan. 22, 2016, now U.S. Pat. No. 9,837,984, and titled RF LADDER FILTER WITH SIMPLIFIED ACOUSTIC RF RESONATOR PARALLEL CAPACITANCE COMPENSATION, and U.S. patent application Ser. No. 14/757,651, filed Dec. 23, 2015, and titled SIMPLIFIED ACOUSTIC RF RESONATOR PARALLEL CAPACITANCE COMPENSATION, which are incorporated herein by reference.

While beneficial in many applications, the narrow passband of the circuit topology of FIG. 7 has its limitations. With the challenges of modern day communication systems, wider passbands and the ability to provide multiple passbands within a given system are needed. Fortunately, applicants have discovered that certain modifications to this topology provide significant and truly unexpected increases in passband bandwidths and, in certain instances, the ability to generate multiple passbands of the same or varying bandwidths in an efficient and effective manner.

Figure 9:
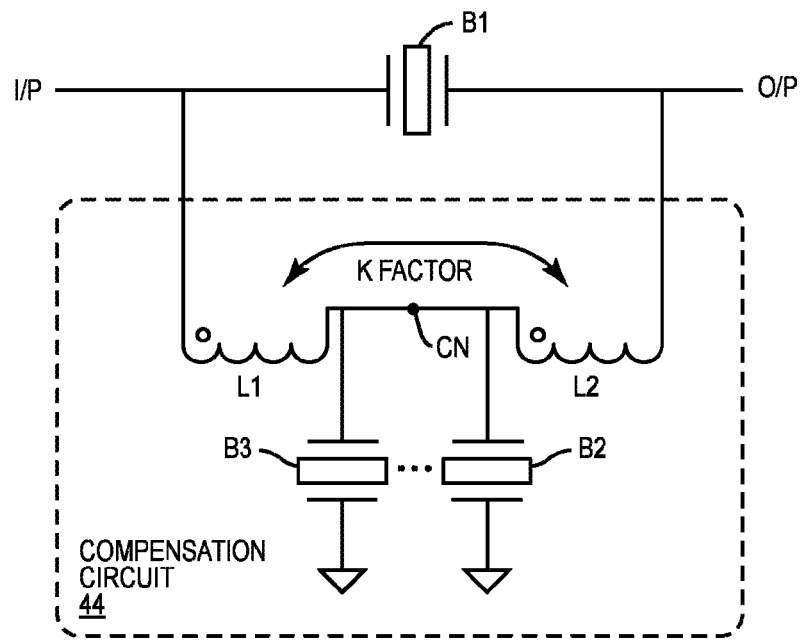
FIG. 9 illustrates an acoustic resonator in parallel with a compensation circuit, which includes at least two shunt acoustic resonators, according to a first embodiment.

With reference to FIG. 9, a modified circuit topology is illustrated wherein the circuit topology of FIG. 7 is modified to include an additional shunt resonator B3, which is coupled between the common node CN and ground. As such, a new compensation circuit 44 is created that includes the negatively coupled inductors L1 and L2, which have a coupling coefficient K, and at least two shunt resonators B2, B3. The compensation circuit 44 is coupled in parallel with the series resonator B1. When the series resonance frequencies $F_s$ of the shunt resonators B2, B3 are different from one another, unexpectedly wide bandwidths passbands are achievable while maintaining a very flat passbands, steep skirts, and excellent cancellation of signals outside of the passbands.

Figure 10:
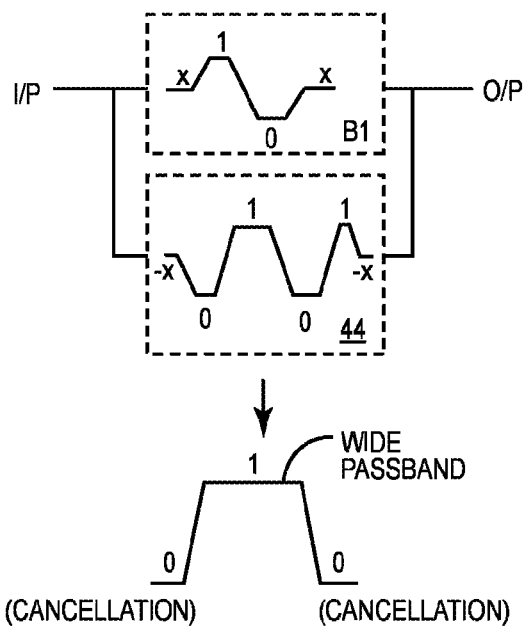
FIG. 10 is a graph that illustrates exemplary frequency responses for the acoustic resonator, compensation circuit, and overall circuit of FIG. 9.

FIG. 10 graphically illustrates the frequency responses of the series resonator B1 (inside the block referenced B1), the compensation circuit 44 (inside the block referenced 44), and the overall circuit in which the compensation circuit 44 is placed in parallel with the series resonator B1. As illustrated, the overall circuit with the compensation circuit 44 provides a much wider passband (FIG. 10) than the overall circuitry with the compensation circuit 42 (FIG. 8).

Figure 11:
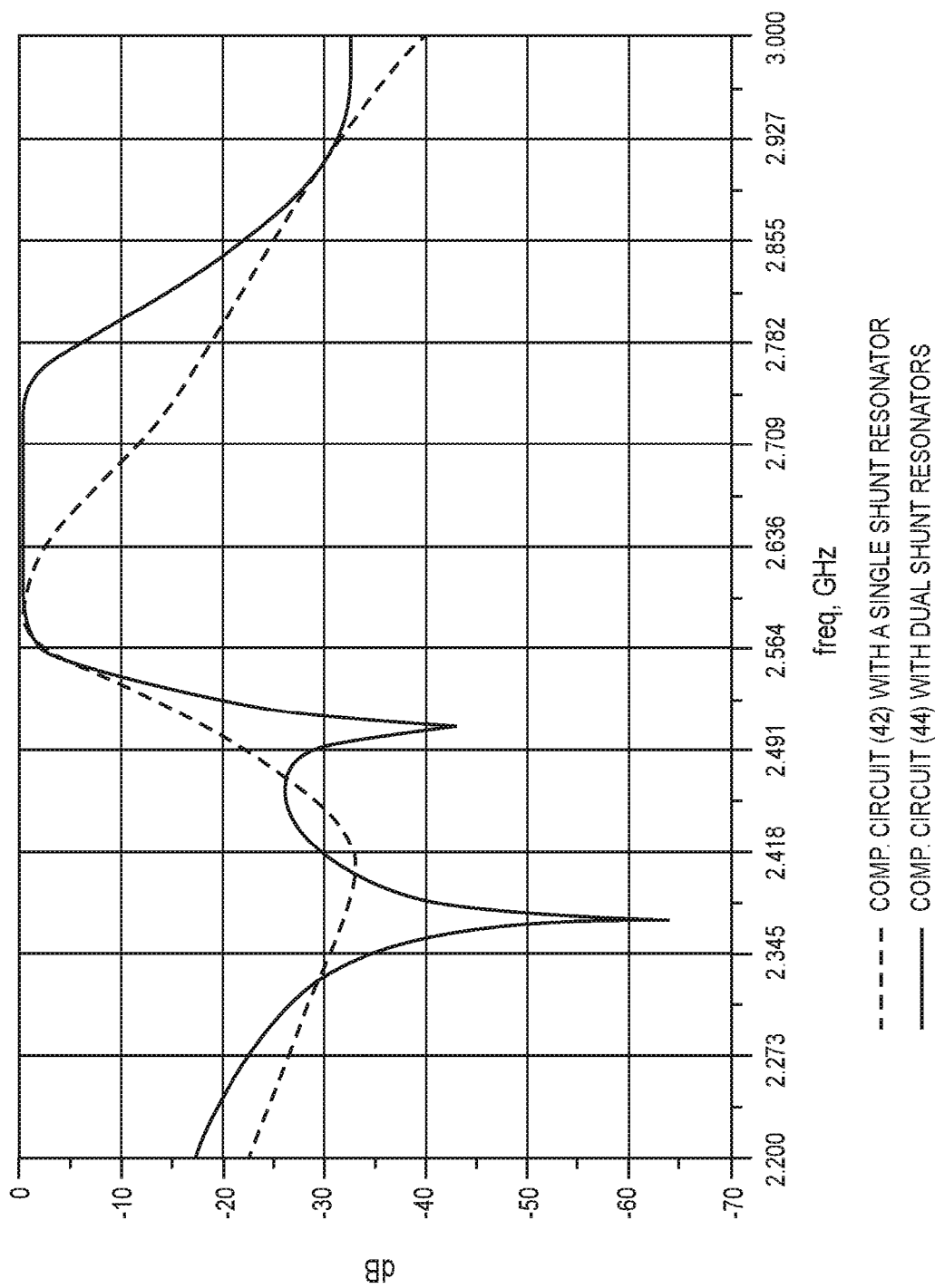
FIG. 11 is a graph that compares actual frequency responses of the overall circuits of FIGS. 7 and 9.

While FIGS. 8 and 10 are graphical representations, FIG. 11 is an actual comparison of the frequency response of the overall circuit using the different compensation circuits 42, 44, wherein the overall circuit using the compensation circuit 44 provides a significantly wider and better formed passband (solid line) than the overall circuit using the compensation circuit 42 (dashed line).

Figure 12:
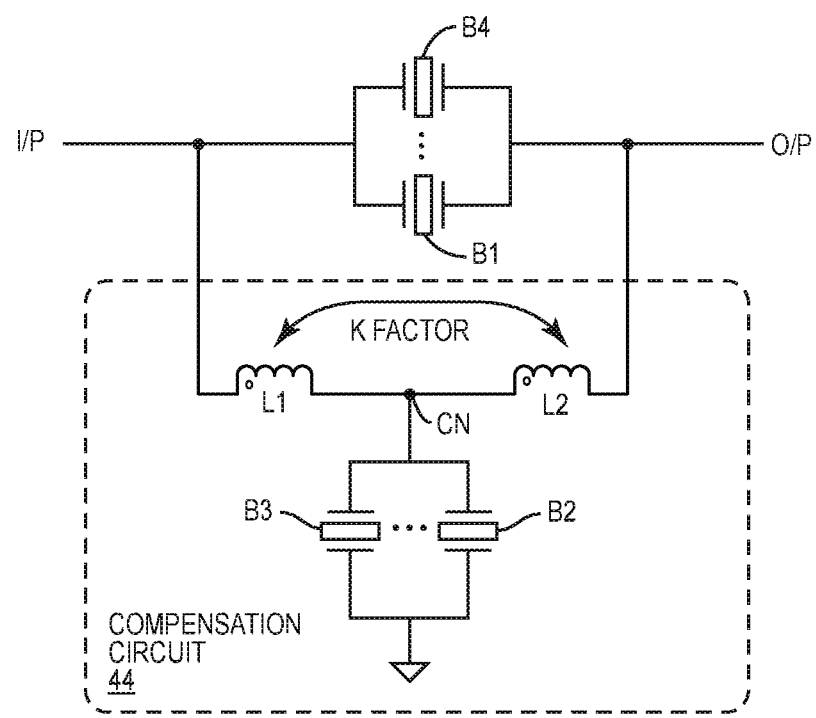
FIG. 12 illustrates a plurality of parallel acoustic resonators in parallel with a compensation circuit, which includes at least two shunt acoustic resonators, according to a second embodiment.

As illustrated in FIG. 12, the concepts described herein not only contemplate the use of multiple shunt resonators B2, B3, which are coupled between the common node CN and ground, but also multiple series resonators, such as series resonators B1 and B4, which are coupled in parallel with one another between the input node VP and the output node O/P. The series resonance frequencies $F_s$ of the series resonators B1, B4 are different from one another, and the series resonance frequencies $F_s$ of the shunt resonators B2, B3 are also different from one another and different from those of the series resonators. While only two series resonators B1, B4 and two shunt resonators B2, B3 are illustrated, any number of these resonators may be employed depending on the application and the desired characteristics of the overall frequency response of the circuit in which these resonators and associated compensation circuits 44 are employed. While the theory of operation is described further subsequently, FIGS. 13 and 14 illustrate just two of the many possibilities.

Figure 13:
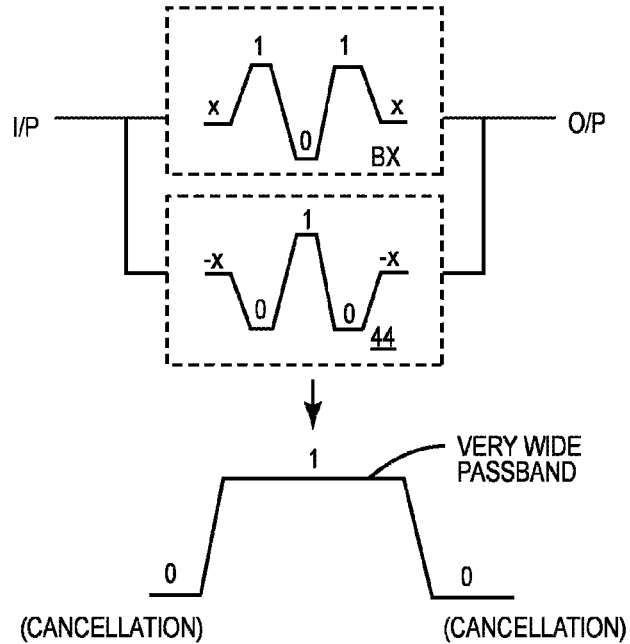
FIG. 13 is a graph that illustrates first exemplary frequency responses for the acoustic resonator, compensation circuit, and overall circuit of FIG. 12.

For FIG. 13, there are two series resonators B1, B4 and two shunt resonators B2, B3, with different and relatively dispersed series resonance frequencies $F_s$. FIG. 13 graphically illustrates the frequency responses of the combination of the two series resonators B1, B4 (inside the block referenced BX), the compensation circuit 44 with two shunt resonators B2, B3 (inside the block referenced 44), and the overall circuit in which the compensation circuit 44 is placed in parallel with the series resonator B1. As illustrated, the overall circuit in this configuration has the potential to provide a passband that is even wider than that for the embodiment of FIGS. 9 and 10. For example, passbands of greater than 100 MHz, 150 MHz, 175 MHz, and 200 MHz are contemplated at frequencies at or above 1.5 GHz, 1.75 GHz, and 2 GHz. In other words, center frequency to bandwidth ratios (fc/BW*100) of 3.5% to 9%, 12%, or greater are possible, wherein fc is the center frequency of the passband and BW is the bandwidth of the passband. If multiple passbands are provided, BW may encompass all of the provided passbands. Further, when multiple passbands are provided, the passbands may have the same or different bandwidths or center frequency to bandwidth ratios. For example, one passband may have a relatively large center frequency to bandwidth ratio, such as 12%, and a second passband may have a relatively small center frequency to bandwidth ratio, such as 2%. Alternatively, multiple ones of the passbands may have a bandwidth of 100 MHz, or multiple ones of the passbands may have generally the same center frequency to bandwidth ratios. In the latter case, the bandwidths of the passbands may inherently be different from one another, even though the center frequency to bandwidth ratios are the same.

Figure 14:
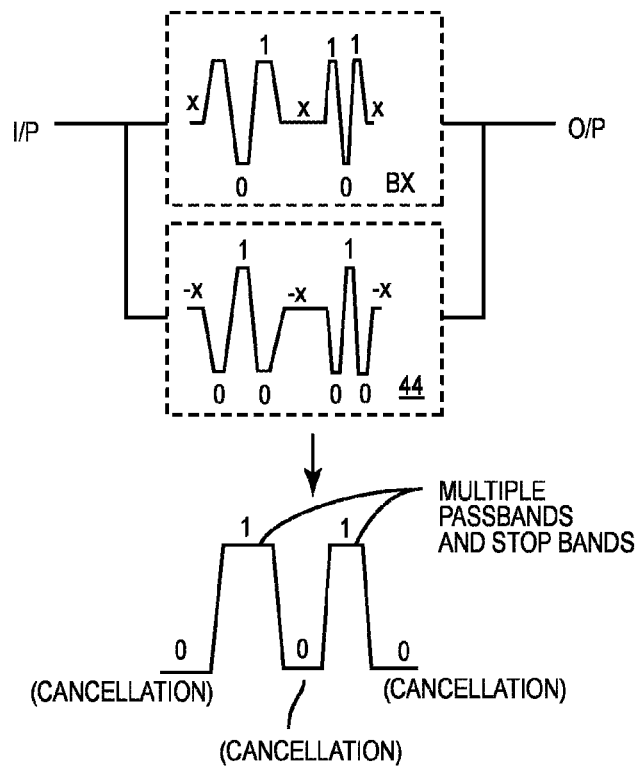
FIG. 14 is a graph that illustrates second exemplary frequency responses for the acoustic resonator, compensation circuit, and overall circuit of FIG. 12.

For FIG. 14, there are four series resonators, which are coupled in parallel with one another (not shown), and two shunt resonators (not shown) with different and more widely dispersed series resonance frequencies $F_s$. FIG. 14 graphically illustrates the frequency responses of the combination of the four series resonators (inside the block referenced BX), the compensation circuit 44 with two shunt resonators B2, B3 (inside the block referenced 44), and the overall circuit in which the compensation circuit 44 is placed in parallel with the series resonator B1. As illustrated, the overall circuit in this configuration provides multiple passbands, which are separated by a stop band. In this embodiment, two passbands are provided; however, the number of passbands may exceed two. The number of passbands in the bandwidth of each of the passbands is a function of the number of shunt and series resonators B1-B4 and the series resonance frequencies $F_s$ thereof.

Figure 15A:
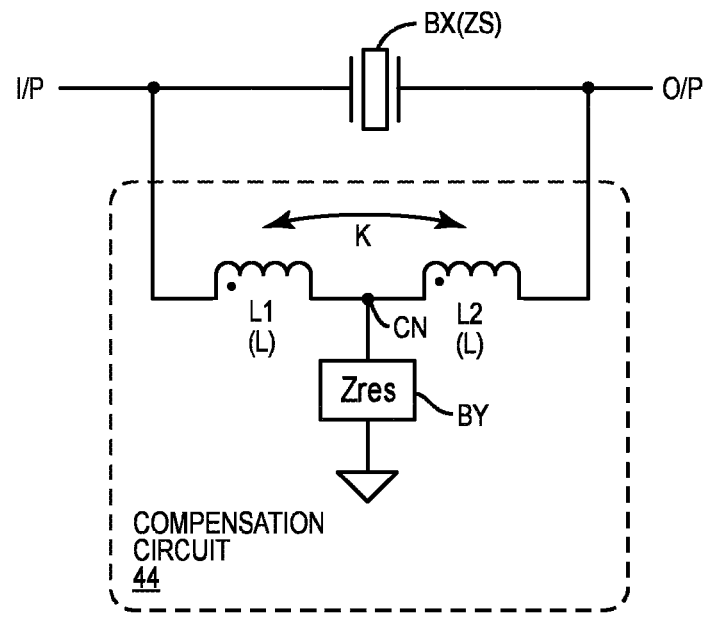
FIGS. 15A through 15D illustrate transformation of the T-circuit impedance architecture of the compensation circuit of FIG. 9 to a π (pi) impedance model.

The theory of the compensation circuit 44 follows and is described in association with FIGS. 15A through 15D and 16. With reference to FIG. 15A, assume the compensation circuit 44 includes the two negatively coupled inductors L1, L2, which have an inductance value L, and two or more shunt resonators BY, which have an overall shunt impedance Zres presented between the common node CN ground. While the inductance values L of the negatively coupled inductors L1, L2 are described as being the same, these values may differ depending on the application. Also assume that the one or more series resonators BX present an overall series impedance ZS.

Figure 15B:
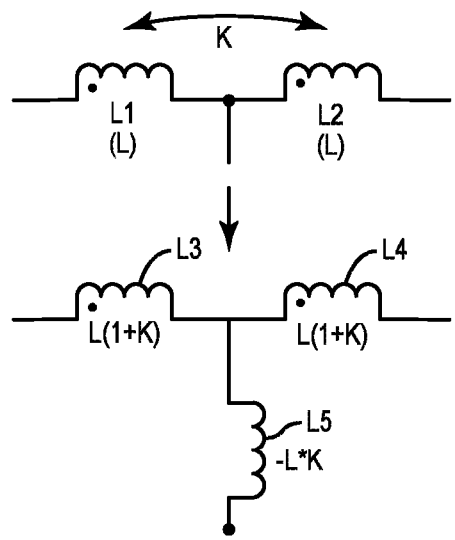
Figure 15C:
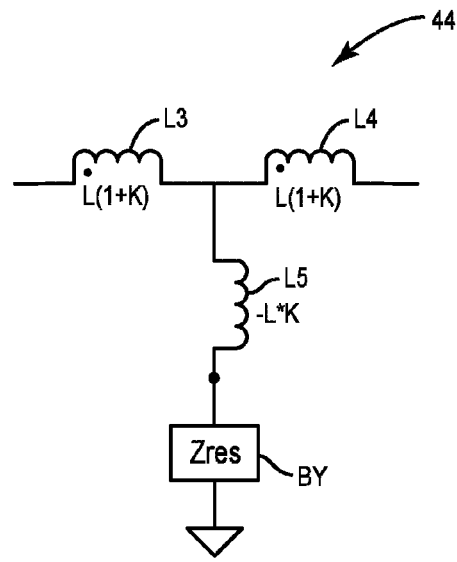

As shown in FIG. 15B, the two negatively coupled and series-connected inductors L1, L2 (without Zres) can be modeled as a T-network of three inductors L3, L4, and L5, wherein series inductors L3 and L4 are connected in series and have a value of $L(1+K)$, and shunt inductor L5 has a value of $-L*K$, where K is a coupling factor between the negatively coupled inductors L1, L2. Notably, the coupling factor K is a positive number between 0 and 1. Based on this model, the overall impedance of the compensation circuit 44 is modeled as illustrated in FIG. 15C, wherein the shunt impedance Zres is coupled between the shunt inductor L5 and ground. The resulting T-network, as illustrated in FIG. 15C, can be transformed into an equivalent π (pi) network, as illustrated in FIG. 15D.

Figure 15D:
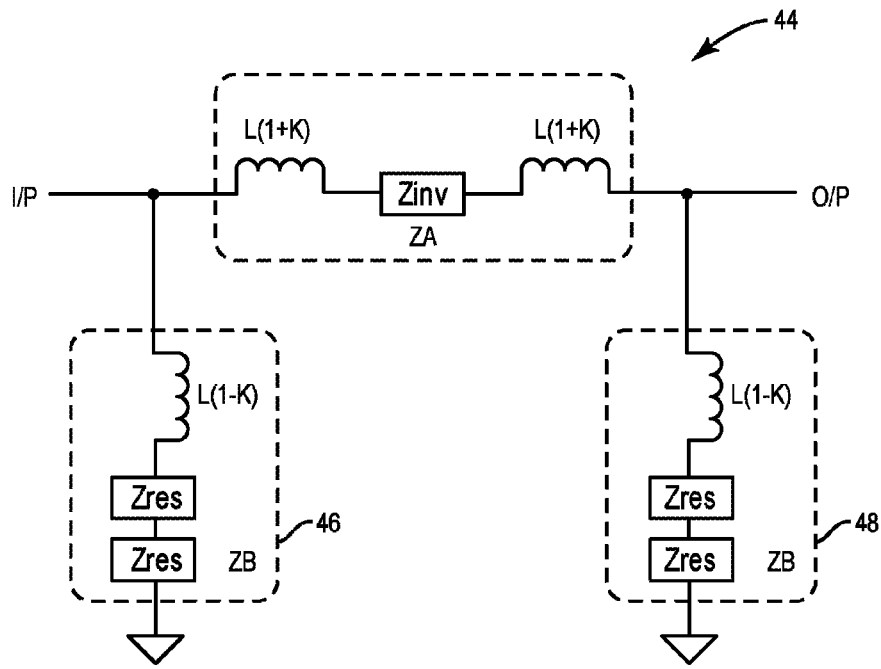

The π network of FIG. 15D can be broken into a series impedance ZA and two shunt equivalent impedances ZB. The series equivalent impedance ZA is represented by two series inductances of value $L*(1+K)$, where $K>0$, and a special "inversion" impedance Zinv. The inversion impedance Zinv is equal to $[L(1+K)\omega]^2/[Zres-jLK\omega]$, where $\omega=2\pi f$ and f is the frequency. As such, the series equivalent impedance ZA equals $j*2*L(1+K)\omega+Zinv$ and is coupled between the input node I/O and the output node O/P. Each of the two shunt equivalent impedances ZB is represented by an inductor of value $L(1-K)$ in series with two overall shunt impedances Zres.

Notably, the series equivalent impedance ZA has a negative capacitor behavior at certain frequencies at which broadband cancellation is desired and has series resonance at multiple frequencies. In general, the series equivalent impedance ZA has a multiple bandpass-bandstop characteristic in that the series equivalent impedance ZA will pass some frequencies and stop others. When the series equivalent impedance ZA is placed in parallel with the series impedance Zs of the series resonators BX, which can also have a multiple bandpass-bandstop characteristic, a broadband filter or a filter with multiple passbands may be created.

Figure 16:
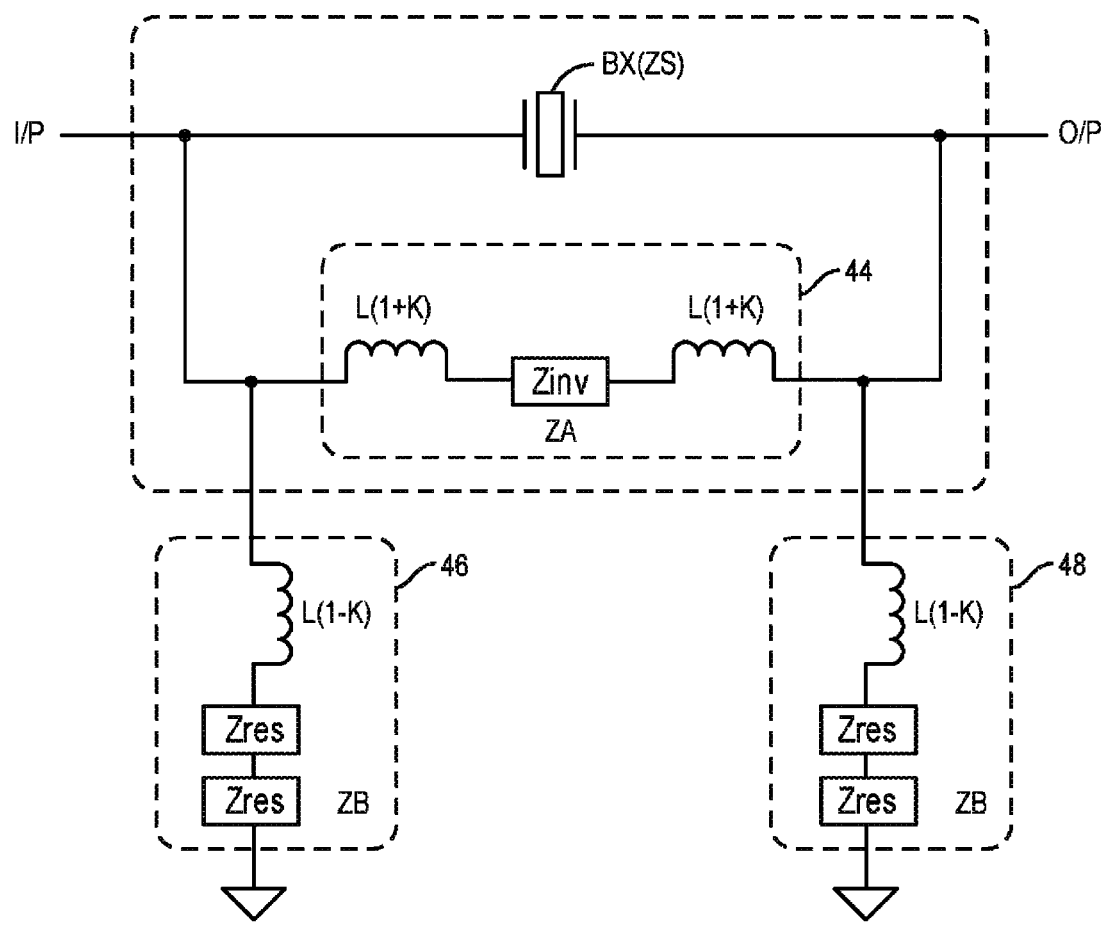
FIG. 16 illustrates the overall circuit of FIG. 9 using the π (pi) impedance model of FIG. 15D.

FIG. 16 illustrates the series impedance ZS of the series resonators BX in parallel with the series equivalent impedance ZA of the compensation circuit 44. The overall series impedance ZAs represents the series impedance ZS in parallel with the series equivalent impedance ZA. The two shunt impedances ZB are respectively coupled between the input port I/P and ground and the output port O/P and ground. The primary focus for the following discussion relates to the series equivalent impedance ZA and its impact on the series impedance ZS when the series equivalent impedance ZA is placed in parallel with the series impedance ZS.

Figure 17:
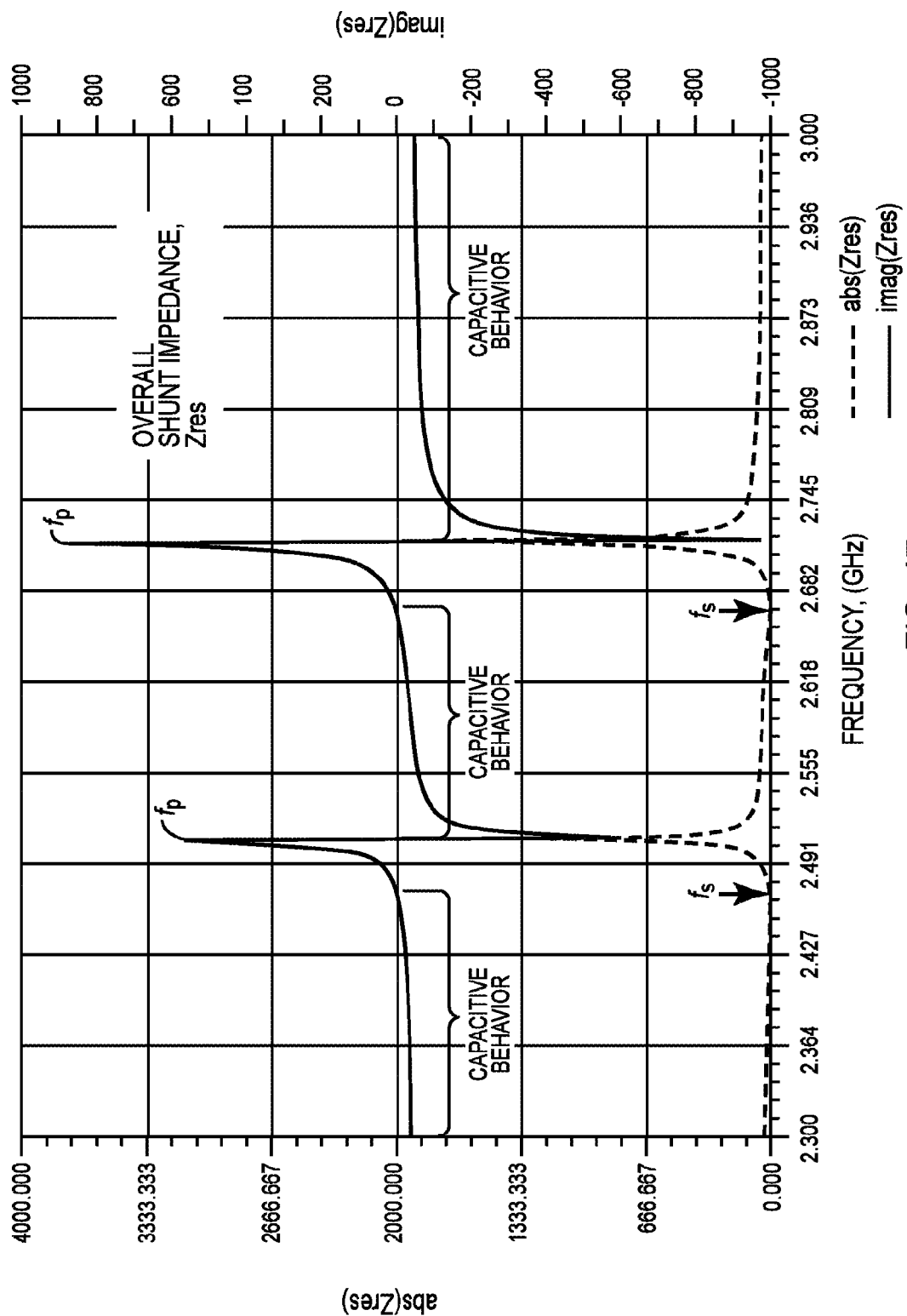
FIG. 17 is a graph illustrating the overall shunt impedance, Zres, according to one embodiment.

As noted previously, the series equivalent impedance ZA provides two primary functions. The first provides a negative capacitive behavior, and the second provides one or more additional series resonances between the input node I/P and the output node O/P. These additional series resonances are provided through the series equivalent impedance ZA and are in addition to any series resonances that are provided through the series impedance ZS of the series resonators BX. To help explain the benefits and concept of the negative capacitive behavior provided by the series equivalent impedance ZA, normal capacitive behavior is illustrated in association with the overall shunt impedance Zres, which is provided by the shunt resonators BY. FIG. 17 graphs the absolute (magnitude) and imaginary components of the overall shunt impedance Zres, which is formed by two shunt resonators BY, which are coupled in parallel with one another.

The series resonance frequency $F_s$ for each of the two shunt resonators BY occurs when the absolute impedance (abs(Zres)) is at or near zero. Since there are two shunt resonators BY, the absolute impedance (abs(Zres)) is at or near zero at two frequencies, and as such, there are two series resonance frequencies $F_s$. The parallel resonance frequencies $F_p$ occur when the imaginary component (imag(Zres)) peaks. Again, since there are two shunt resonators BY, there are two series resonance frequencies $F_s$ provided by the overall shunt impedance Zres.

Whenever the imaginary component (imag(Zres)) of the overall shunt impedance Zres is less than zero, the overall shunt impedance Zres has a capacitive behavior. The capacitive behavior is characterized in that the reactance of the overall shunt impedance Zres is negative and decreases as frequency increases, which is consistent with capacitive reactance, which is represented by $1/j\omega C$. The graph of FIG. 17 identifies three regions within the impedance response of the overall shunt impedance Zres that exhibit capacitive behavior.

Figure 18:
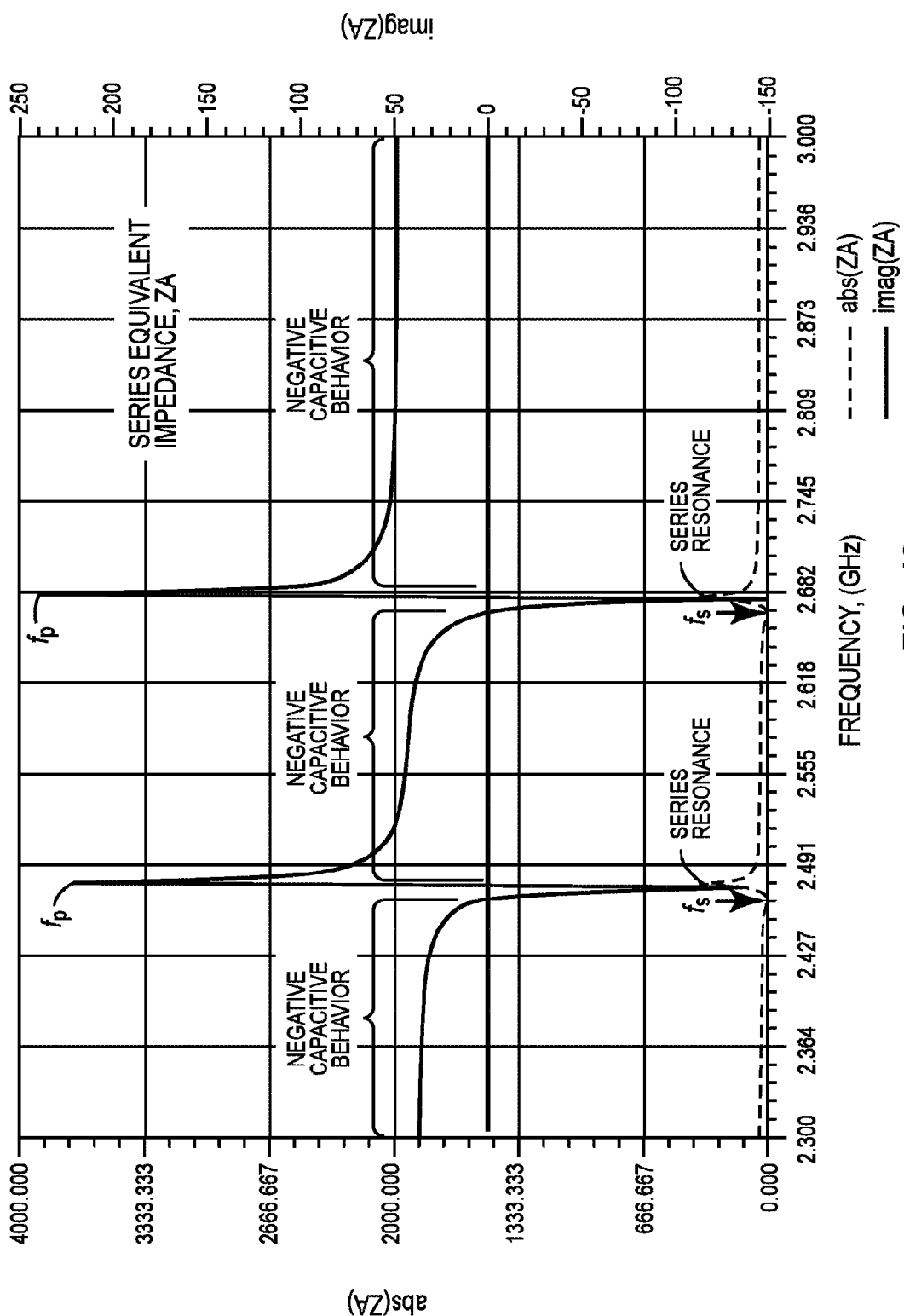
FIG. 18 is a graph illustrating the series equivalent impedance, ZA, according to one embodiment.

Turning now to FIG. 18, the series equivalent impedance ZA is illustrated over the same frequency range as that of the overall shunt impedance Zres, which was illustrated in FIG. 17. The series equivalent impedance ZA has two series resonance frequencies $F_s$, which occur when the absolute impedance (abs(ZA)) is at or near zero. The two series resonance frequencies $F_s$ for the series equivalent impedance ZA are different from each other and slightly different from those for the overall shunt impedance Zres. Further, the number of series resonance frequencies $F_s$ generally corresponds to the number of shunt resonators BY in the compensation circuit 44, assuming the series resonance frequencies $F_s$ are different from one another.

Interestingly, the imaginary component (imag(ZA)) of the series equivalent impedance ZA is somewhat inverted with respect to that of the overall shunt impedance Zres. Further, the imaginary component (imag(ZA)) of the series equivalent impedance ZA has a predominantly positive reactance. During the portions at which the imaginary component (imag(ZA)) is positive, the reactance of the series equivalent impedance ZA again decreases as frequency increases, which is indicative of capacitive behavior. However, the reactance is positive, whereas traditional capacitive behavior would present a negative reactance. This phenomenon is referred to as negative capacitive behavior. Those portions of the imaginary component (imag(ZA)) of the series equivalent impedance ZA that are positive and thus exhibit negative capacitive behavior are highlighted in the graph of FIG. 18.

The negative capacitive behavior of the series equivalent impedance ZA for the compensation circuit 44 is important, because when the series equivalent impedance ZA is placed in parallel with the series impedance ZS, the effective capacitance of the overall circuit is reduced. Reducing the effective capacitance of the overall circuit shifts the parallel resonance frequency $F_p$ of the series impedance ZS higher in the frequency range, which is described subsequently, and significantly increases the available bandwidth for passbands while providing excellent out-of-band rejection.

Figure 19A:
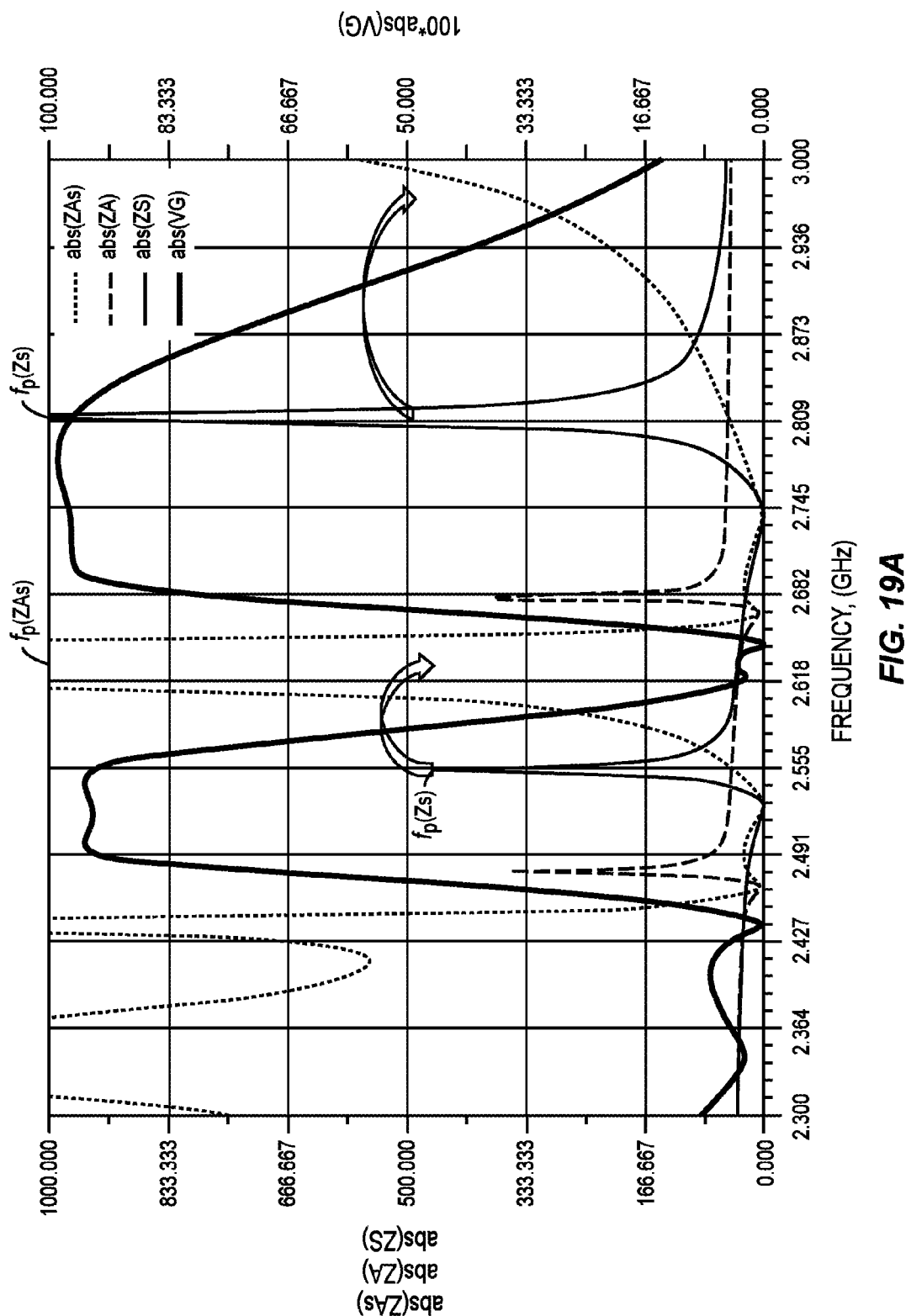
FIGS. 19A and 19B are graphs over different frequency ranges illustrating the absolute or magnitude of series impedance ZS, the series equivalent impedance ZA, and overall series impedance ZAs, according to one embodiment.
Figure 19B:
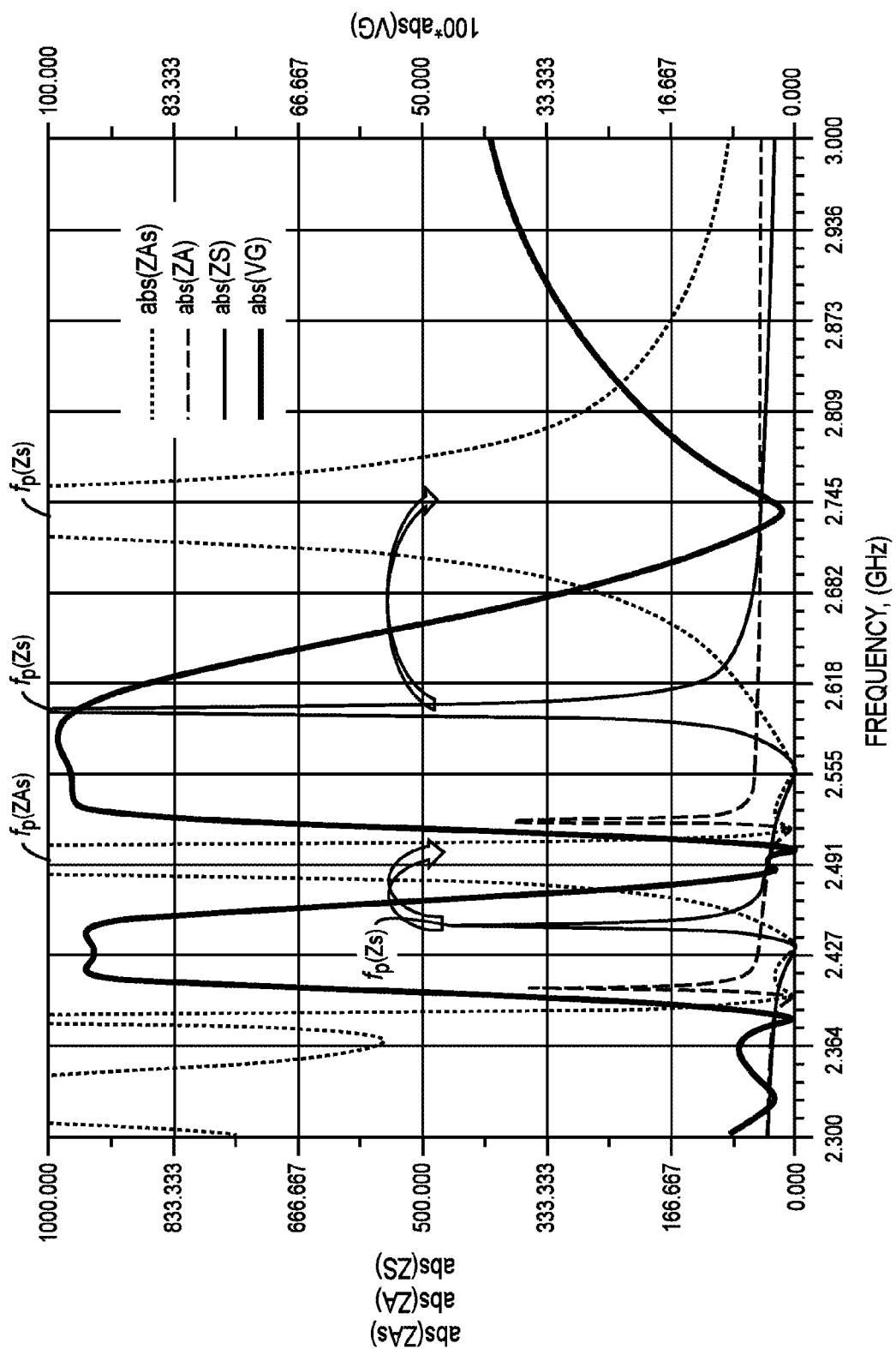

An example of the benefit is illustrated in FIGS. 19A and 19B. The solid line, which is labeled abs(VG), represents the frequency response of the overall circuit illustrated in FIG. 12 wherein there are two series resonators BX and two shunt resonators BY in the compensation circuit 44. The frequency response has two well-defined passbands, which are separated by a stop band. The frequency response abs(VG) of the overall circuit generally corresponds to the inverse of the overall series impedance ZAs, which again represents the series impedance Zs in parallel with the series equivalent impedance ZA, as provided in FIG. 16.

Notably, the parallel resonance frequencies $F_p(ZS)$ of the series impedance ZS, in isolation, fall in the middle of the passbands of frequency response abs(VG) of the overall circuit. If the parallel resonance frequencies $F_p(ZS)$ of the series impedance ZS remained at these locations, the passbands would be severely affected. However, the negative capacitive behavior of the series equivalent impedance ZA functions to shift these parallel resonance frequencies $F_p(ZS)$ of the series impedance ZS to a higher frequency and, in this instance, above the respective passbands. This is manifested in the resulting overall series impedance ZAs, in which the only parallel resonance frequencies $F_p(ZAs)$ occur above and outside of the respective passbands. An additional benefit to having the parallel resonance frequencies $F_p(ZAs)$ occur outside of the respective passbands is the additional cancellation of frequencies outside of the passbands. Plus, the overall series impedance ZAs is lower than the series impedance ZS within the respective passbands.

A further contributor to the exemplary frequency response abs(VG) of the overall circuit is the presence of the additional series resonance frequencies $F_s$, which are provided through the series equivalent impedance ZA. These series resonance frequencies $F_s$ are offset from each other and from those provided through the series impedance ZS. The series resonance frequencies $F_s$ for the series equivalent impedance ZA in the series impedance ZS occur when the magnitudes of the respective impedances approach zero. The practical results are wider passbands, steeper skirts for the passbands, and greater rejection outside of the passbands, as evidenced by the frequency response abs(VG) of the overall circuit.

Figure 20:
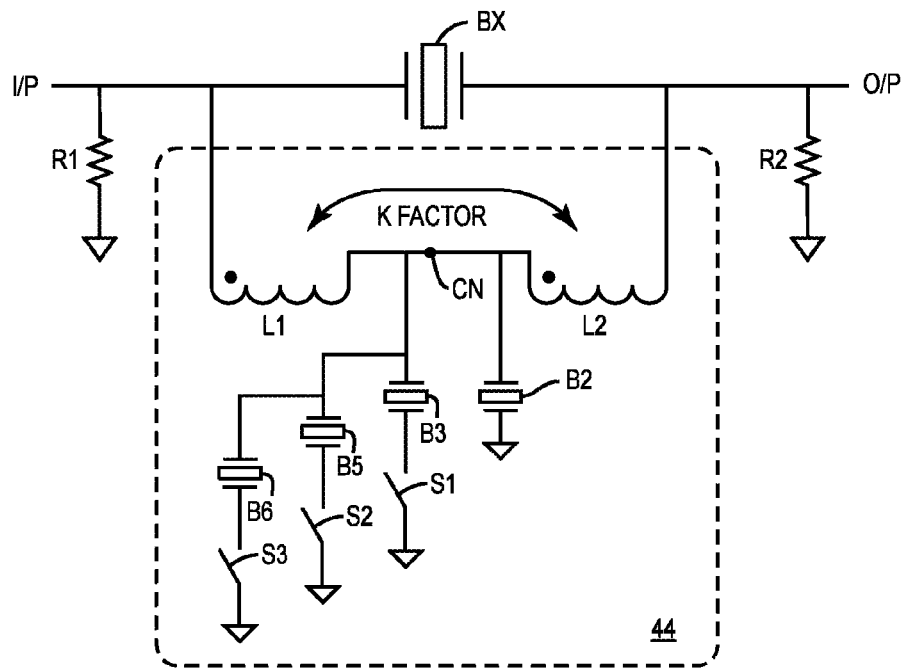
FIG. 20 illustrates an acoustic resonator in parallel with a compensation circuit, which includes at least two shunt acoustic resonators, according to a third embodiment.

Turning now to FIG. 20, another embodiment is provided wherein the compensation circuit 44 is placed in parallel with one or more series resonators BX. In this embodiment, shunt resonator B2 is permanently coupled between the common node CN and ground. Shunt resonators B3, B5, and B6 can be selectively coupled between the common node CN and ground via respective switches S1, S2, and S3. By using control circuitry (not shown) to selectively switch the various shunt resonators B3, B5, and B6 into and out of the compensation circuit 44, the passbands and stop bands provided by the overall circuit can be dynamically adjusted for different modes of operation. Again, the series resonance frequencies $F_s$ of the shunt resonators B2, B3, B5, and B6 will generally differ from one another. Resistors R1 and R2 are illustrated and may be coupled between the input node VP and ground and the output node O/P and ground, respectively. In one embodiment, the series resonance frequency $F_s$ of the series equivalent impedance ZA is greater than the series resonance frequency $F_s$ of the series impedance ZS. The series resonance frequency $F_s$ of at least one of the shunt resonators B2, B3, B5, and B6 is greater than the series resonance frequency $F_s$ of the series impedance ZS. As with any of these embodiments, the number of shunt resonators BY and series resonators BX may vary from embodiment to embodiment. The number illustrated is merely for illustrative purposes.

Figure 21:
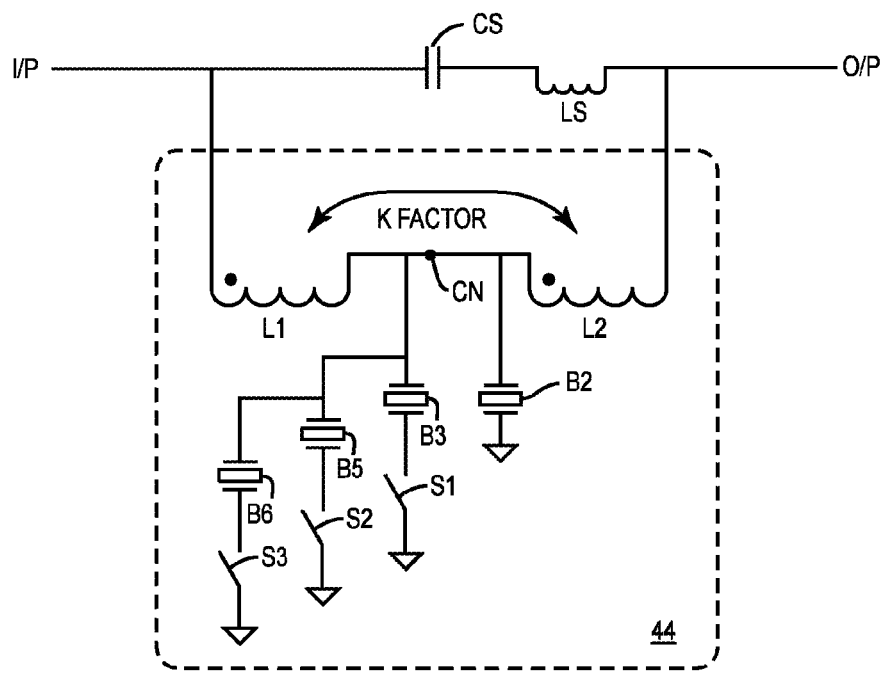
FIG. 21 illustrates a series resonant inductor-capacitor (L-C) circuit in parallel with a compensation circuit, which includes at least two shunt acoustic resonators, according to a fourth embodiment.

FIG. 21 illustrates yet another embodiment, which is similar to that illustrated in FIG. 20. The difference is that the series resonators BX are replaced with a lumped series L-C circuit, which is formed from a series capacitors CS and a series inductor LS that are coupled in series between the input node I/P and the output node O/P.

Figure 22:
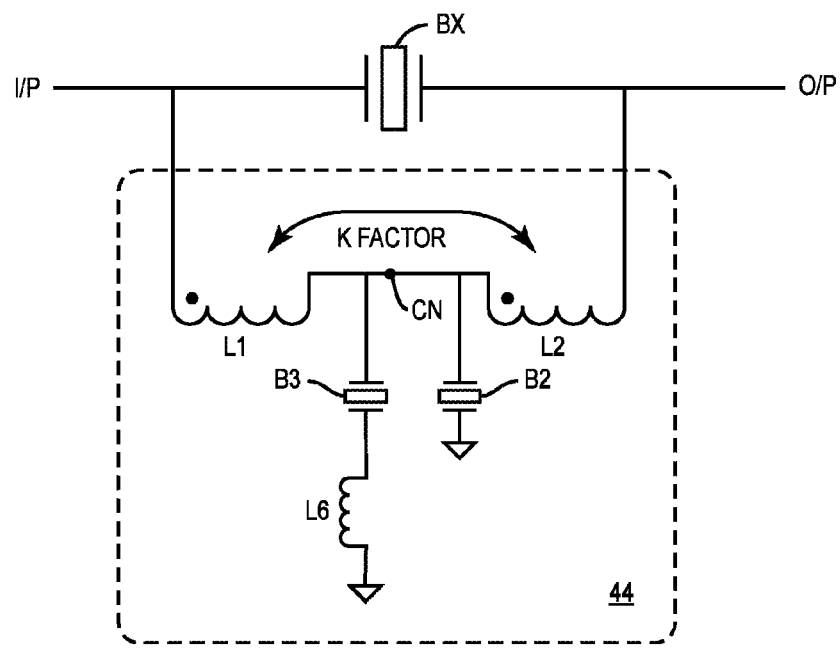
FIG. 22 illustrates an acoustic resonator in parallel with a compensation circuit, which includes at least two shunt acoustic resonators, according to a fifth embodiment.
Figure 23:
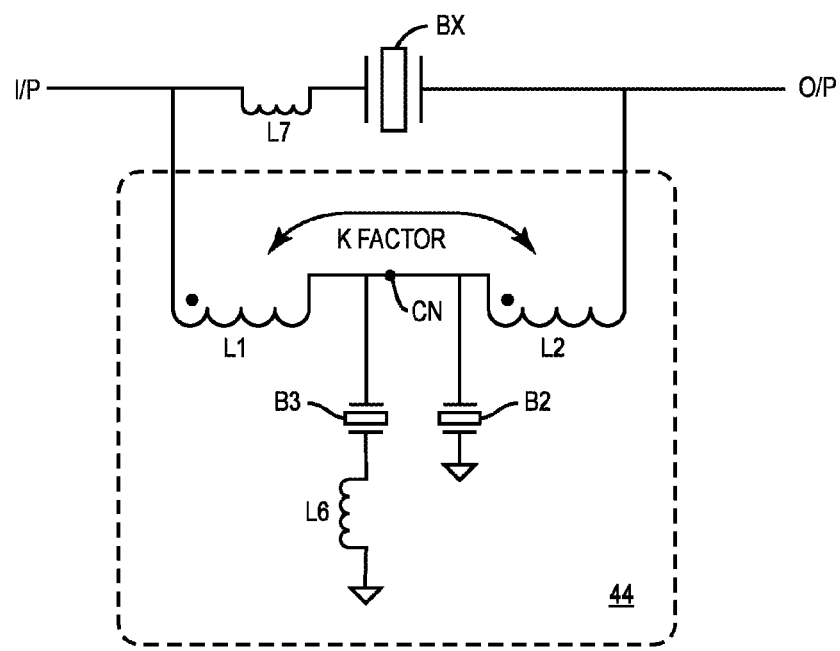
FIG. 23 illustrates an acoustic resonator in parallel with a compensation circuit, which includes at least two shunt acoustic resonators, according to a sixth embodiment.

FIG. 22 illustrates an embodiment similar to that of FIG. 9, except that at least one inductor L6 is coupled in series with shunt resonator B3. As such, shunt resonator B2 is coupled between the common node CN and ground without a series inductor, and shunt resonator B2 and inductor L6 are coupled in series with one another and between the common node CN and ground. In one embodiment, the series resonance frequency $F_s$ of the series equivalent impedance ZA is greater than the lowest series resonance frequency $F_s$ of the series impedance ZS. FIG. 23 illustrates a further modification to the embodiment of FIG. 22 wherein an inductor L7 is placed in series with the series resonators BX, such that the inductor L7 and the series resonators BX are coupled in series with one another between the input node I/P and the output node O/P.

Figure 24:
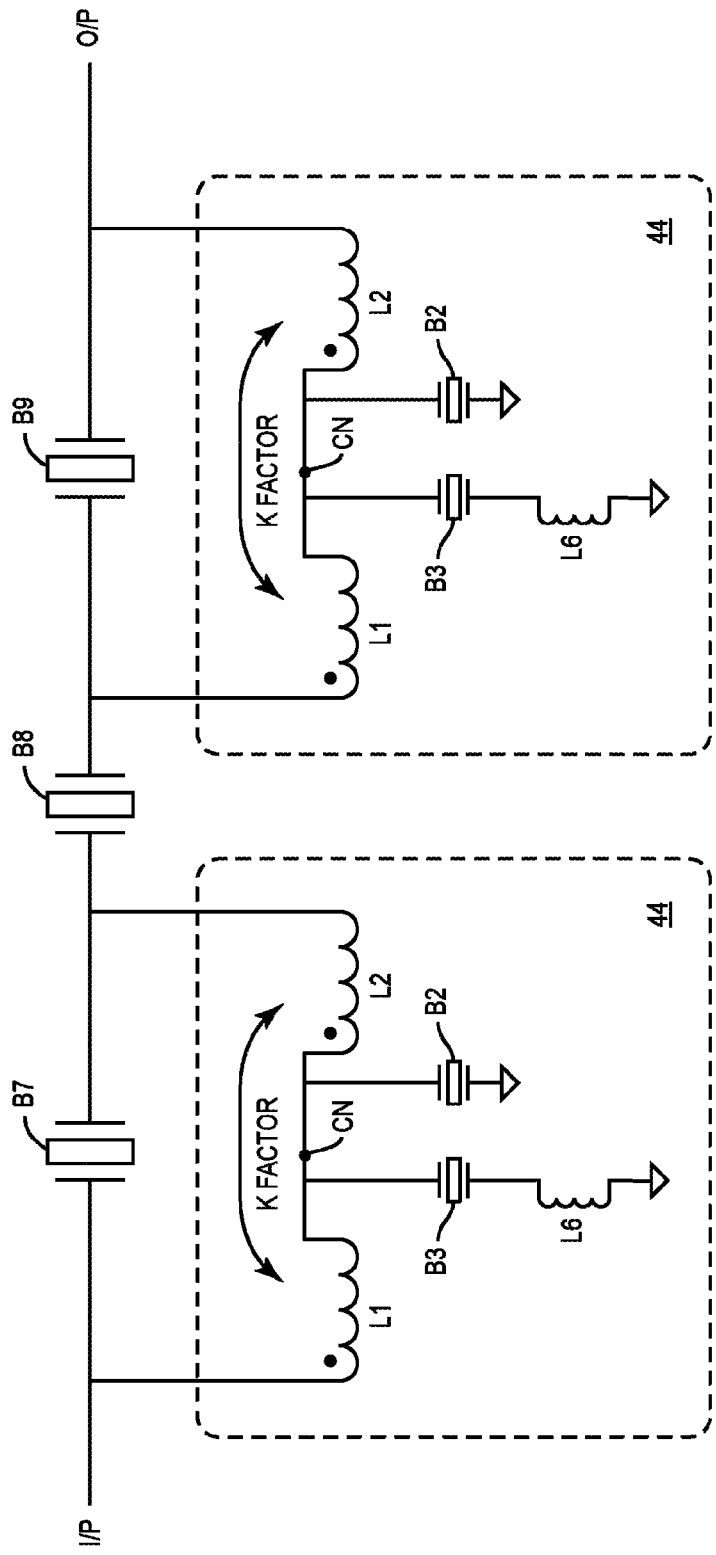
FIG. 24 illustrates an acoustic resonator in parallel with a compensation circuit, which includes at least two shunt acoustic resonators, according to a seventh embodiment.

With reference to FIG. 24, a more complex filter arrangement is illustrated. In particular, resonators B7, B8, and B9 are coupled in series between the input node I/P and the output node O/P. The compensation circuits 44 of FIG. 22 are coupled across resonator B7 and resonator B9. The resonators B7, B8, and B9 may each represent a single acoustic resonator or multiple acoustic resonators in parallel.

Figure 25:
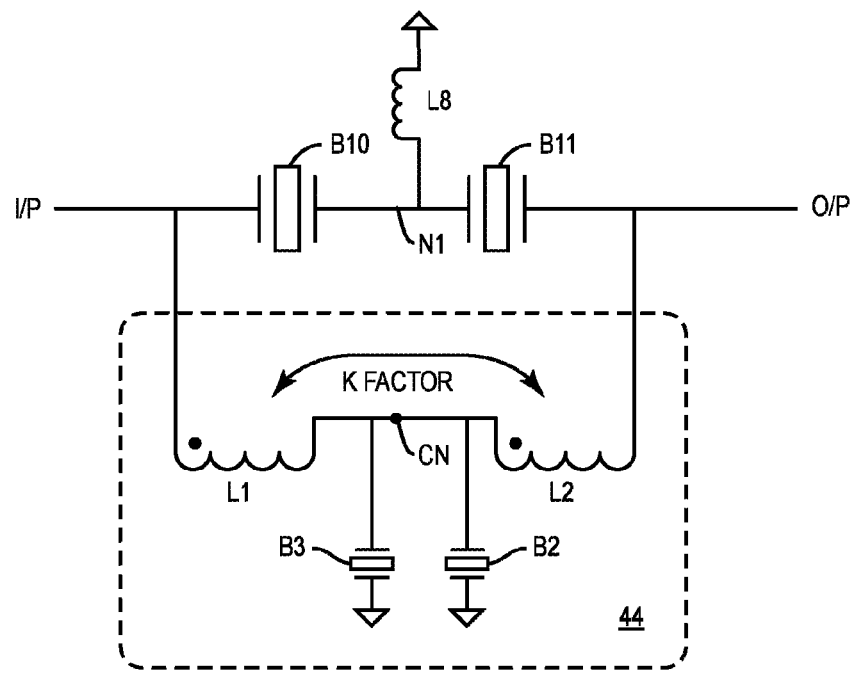
FIG. 25 illustrates two series acoustic resonators in parallel with a compensation circuit, which includes at least two shunt acoustic resonators, according to an eighth embodiment.

FIG. 25 illustrates yet another embodiment wherein resonators B10 and B11 are coupled in series between the input node I/P and the output node O/P. An inductor L8 is coupled between node N1 and ground. The compensation circuit 44 is coupled across both of the resonators B10 and B11. Accordingly, the compensation circuit 44 may be coupled across one or more acoustic resonators along the series path that extends between the input node VP and the output node O/P.

Figure 26:
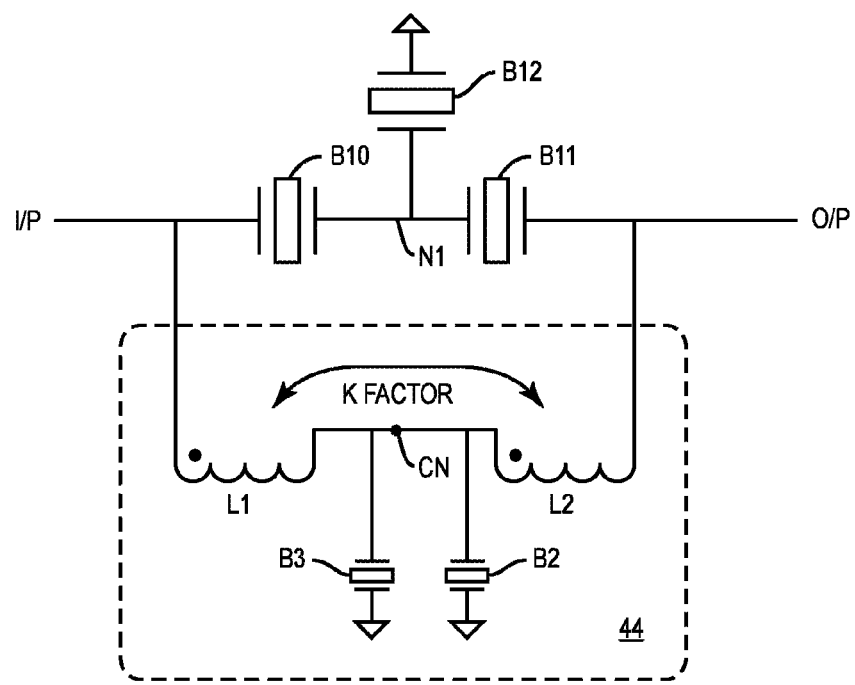
FIG. 26 illustrates two series acoustic resonators in parallel with a compensation circuit, which includes at least two shunt acoustic resonators, according to a ninth embodiment.

FIG. 26 illustrates a modification to the embodiment of FIG. 25, wherein the inductor L8 is replaced with a shunt resonator B12.

Those skilled in the art will recognize numerous modifications and other embodiments that incorporate the concepts described herein. These modifications and embodiments are considered to be within scope of the teachings provided herein and the claims that follow.

What is claimed is:

1. Filter circuitry comprising:
   a first node and a second node;
   at least one series acoustic resonator coupled between the first node and the second node wherein at least one main series resonance is provided between the first node and the second node at a main resonance frequency through the at least one series acoustic resonator; and
   a compensation circuit comprising:
   a first inductor and a second inductor coupled in series between the first node and the second node wherein the first inductor and the second inductor are negatively coupled with one another and a common node is provided between the first inductor and the second inductor;
   a first shunt acoustic resonator coupled between the common node and a fixed voltage node; and
   a second shunt acoustic resonator coupled between the common node and the fixed voltage node, wherein a first series resonance at a first resonance frequency and a second series resonance at a second resonance frequency, which is different from the first resonance frequency and main resonance frequency, are provided between the first node and the second node through the compensation circuit.

2. The filter circuitry of claim 1 wherein at least one of the first resonance frequency and the second resonance frequency is greater than the main resonance frequency.

3. The filter circuitry of claim 1 wherein the first resonance frequency is less than the main resonance frequency, and the second resonance frequency is greater than the main resonance frequency.

4. The filter circuitry of claim 1 wherein the at least one series acoustic resonator comprises a plurality of acoustic resonators that are coupled in parallel with one another and each of the plurality of acoustic resonators has a different series resonance frequency.

5. The filter circuitry of claim 1 wherein the compensation circuit comprises at least one additional shunt acoustic resonator coupled between the common node and the fixed voltage node.

6. The filter circuitry of claim 1 wherein:
an equivalent π (pi) network of the compensation circuit comprises a series equivalent impedance between the first node and the second node and two shunt equivalent impedances; and
the series equivalent impedance exhibits negative capacitive behavior throughout multiple frequency ranges.

7. The filter circuitry of claim 1 wherein:
an equivalent π (pi) network of the compensation circuit comprises a series equivalent impedance between the first node and the second node and two shunt equivalent impedances; and
the first series resonance at the first resonance frequency and the second series resonance at the second resonance frequency are provided through the series equivalent impedance.

8. The filter circuitry of claim 1 wherein:
an equivalent π (pi) network of the compensation circuit comprises a series equivalent impedance between the first node and the second node and two shunt equivalent impedances;
the at least one series acoustic resonator comprising a series impedance having a parallel resonance at a first parallel resonance frequency; and
the series impedance of the at least one series acoustic resonator in parallel with the series equivalent impedance of equivalent π (pi) network of the compensation circuit provides an overall impedance having a parallel resonance at a second parallel resonance frequency, which is greater than the first parallel resonance frequency.

9. The filter circuitry of claim 1 wherein:
an equivalent π (pi) network of the compensation circuit comprises a series equivalent impedance between the first node and the second node and two shunt equivalent impedances;
the at least one series acoustic resonator comprising a series impedance having a parallel resonance at a first parallel resonance frequency;
the series impedance of the at least one series acoustic resonator in parallel with the series equivalent impedance of equivalent π (pi) network of the compensation circuit provides an overall impedance having a parallel resonance at a second parallel resonance frequency, which is greater than the first parallel resonance frequency; and the series equivalent impedance exhibits negative capacitive behavior throughout multiple frequency ranges.

10. The filter circuitry of claim 9 wherein at least one of the first resonance frequency and the second resonance frequency is greater than the main resonance frequency.

11. The filter circuitry of claim 9 wherein the first resonance frequency is less than the main resonance frequency, and the second resonance frequency is greater than the main resonance frequency.

12. The filter circuitry of claim 1 wherein at least one of the first shunt acoustic resonator and the second shunt acoustic resonator have a series resonance at a third resonance frequency wherein the third resonance frequency is greater than the main resonance frequency.

13. The filter circuitry of claim 1 wherein the first inductor and the second inductor have different inductances.

14. The filter circuitry of claim 1 wherein the at least one series acoustic resonator, the first shunt acoustic resonator, and the second shunt acoustic resonator are at least one of a bulk acoustic wave (BAW) resonator and a surface acoustic wave (SAW).

15. The filter circuitry of claim 1 wherein a fc/BW*100 is between 3.5% and 12%, wherein fc is a center frequency of a passband of the filter circuitry, and BW is a bandwidth of the passband.

16. The filter circuitry of claim 1 wherein a frequency response of the filter circuitry comprises a plurality of passbands such that adjacent passbands of the plurality of passbands are separated by stop band.

17. The filter circuitry of claim 1 further comprising a first switch coupled in series with the second shunt acoustic resonator wherein the first switch and the second shunt acoustic resonator are coupled between the common node and the fixed voltage node.

18. The filter circuitry of claim 17 further comprising a second switch coupled in series with a third shunt acoustic resonator wherein the second switch and the third shunt acoustic resonator are coupled between the common node and the fixed voltage node.

19. The filter circuitry of claim 1 further comprising a third inductor coupled in series with the second shunt acoustic resonator wherein the third inductor and the second shunt acoustic resonator are coupled between the common node and the fixed voltage node.

20. The filter circuitry of claim 1 wherein the at least one series acoustic resonator comprises a plurality of series acoustic resonators that are coupled in series with one another between the first node and the second node.

21. The filter circuitry of claim 20 wherein a third inductor is coupled between a node that resides between two adjacent series acoustic resonators of the plurality of series acoustic resonators and the fixed voltage node.

22. Filter circuitry comprising:
a first node and a second node;
at least one series resonant circuit coupled between the first node and the second node wherein at least one main series resonance is provided between the first node and the second node at a main resonance frequency through the at least one series resonant circuit; and
a compensation circuit comprising:
a first inductor and a second inductor coupled in series between the first node and the second node wherein the first inductor and the second inductor are negatively coupled with one another and a common node is provided between the first inductor and the second inductor;

a first shunt acoustic resonator coupled between the common node and a fixed voltage node; and a second shunt acoustic resonator coupled between the common node and the fixed voltage node, wherein a first series resonance at a first resonance frequency and a second series resonance at a second resonance frequency, which is different from the first resonance frequency and main resonance frequency, are provided between the first node and the second node through compensation circuit.

23. The filter circuitry of claim 22 wherein the at least one series resonant circuit comprises a first capacitor and a third inductor, which is coupled in series with the first capacitor.

24. The filter circuitry of claim 22 wherein the at least one series resonant circuit comprises at least one acoustic resonator.

25. The filter circuitry of claim 22 further comprising a first switch coupled in series with the second shunt acoustic resonator wherein the first switch and the second shunt acoustic resonator are coupled between the common node and the fixed voltage node.

26. The filter circuitry of claim 25 further comprising a second switch coupled in series with a third shunt acoustic resonator wherein the second switch and the third shunt acoustic resonator are coupled between the common node and the fixed voltage node.

\* \* \* \* \*

UNITED STATES PATENT AND TRADEMARK OFFICE
CERTIFICATE OF CORRECTION

PATENT NO. : 10,097,161 B2
APPLICATION NO. : 15/275957
DATED : October 9, 2018
INVENTOR(S) : Nadim Khlat et al.

Page 1 of 1

It is certified that error appears in the above-identified patent and that said Letters Patent is hereby corrected as shown below:

In the Specification

In Column 10, Line 1, replace "the input node VP" with --the input node I/P--.

In Column 11, Line 31, replace "the input node I/O" with --the input node I/P--.

In Column 13, Line 57, replace "VP" with --I/P--.

In Column 14, Line 36, replace "the input node VP" with --the input node I/P--.

Signed and Sealed this
Fourth Day of December, 2018

Andrei Iancu
*Director of the United States Patent and Trademark Office*